US012674058B2

(12) United States Patent
Kwon et al.

(10) Patent No.: US 12,674,058 B2
(45) Date of Patent: Jul. 7, 2026

(54) COMPOUND, PHOTOSENSITIVE RESIN COMPOSITION COMPRISING SAME, PHOTOSENSITIVE RESIN FILM, COLOR FILTER AND CMOS IMAGE SENSOR

(71) Applicant: SAMSUNG SDI CO., LTD., Yongin-si (KR)

(72) Inventors: Chang-Hyun Kwon, Suwon-si (KR); Sundae Kim, Suwon-si (KR); Baek Soung Park, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 588 days.

(21) Appl. No.: 18/031,414

(22) PCT Filed: Apr. 26, 2022

(86) PCT No.: PCT/KR2022/005900
§ 371 (c)(1),
(2) Date: Apr. 12, 2023

(87) PCT Pub. No.: WO2022/240012
PCT Pub. Date: Nov. 17, 2022

(65) Prior Publication Data

US 2023/0374312 A1 Nov. 23, 2023

(30) Foreign Application Priority Data

May 11, 2021 (KR) ........................ 10-2021-0060894
Mar. 22, 2022 (KR) ........................ 10-2022-0035509

(51) Int. Cl.

| | |
|---|---|
| ***C09B 11/24*** | (2006.01) |
| ***G02B 5/22*** | (2006.01) |
| ***G03F 7/00*** | (2006.01) |
| ***G03F 7/105*** | (2006.01) |
| ***H10F 39/00*** | (2025.01) |

(52) U.S. Cl.
CPC .............. *C09B 11/24* (2013.01); *G02B 5/223* (2013.01); *G03F 7/0007* (2013.01); *G03F 7/105* (2013.01); *H10F 39/8053* (2025.01)

(58) Field of Classification Search
CPC ....... C09B 11/24; G02B 5/223; G03F 7/0007; G03F 7/105; G03F 7/004; H10F 39/8053
See application file for complete search history.

(56) References Cited

U.S. PATENT DOCUMENTS

| | | | | |
|---|---|---|---|---|
| 6,033,813 | A | 3/2000 | Endo et al. | |
| 2006/0033176 | A1* | 2/2006 | Mun ..................... | H10F 39/024 257/462 |
| 2009/0162776 | A1 | 6/2009 | Hayashi et al. | |
| 2018/0072709 | A1 | 3/2018 | Choi et al. | |

FOREIGN PATENT DOCUMENTS

| | | | | | |
|---|---|---|---|---|---|
| JP | 1994-041458 | A | | 2/1994 | |
| JP | 1995-140654 | A | | 6/1995 | |
| JP | 1998-254133 | A | | 9/1998 | |
| JP | 2009-169407 | A | | 7/2009 | |
| JP | 2020-027303 | A | | 2/2020 | |
| KR | 10-1999-0007097 | A | | 1/1999 | |
| KR | 10-2005-0020653 | A | | 3/2005 | |
| KR | 10-2009-0106226 | A | | 10/2009 | |
| KR | 10-2010-0078845 | A | | 7/2010 | |
| KR | 10-2010-0080142 | A | | 7/2010 | |
| KR | 10-2018-0048067 | A | | 5/2018 | |
| KR | 10-1997656 | B1 | | 7/2019 | |
| KR | 10-2025478 | B1 | | 9/2019 | |
| KR | 102055478 | B1 | * | 12/2019 | ............. G02B 5/223 |
| KR | 10-2020-0023949 | A | | 3/2020 | |
| KR | 10-2020-0034309 | A | | 3/2020 | |
| KR | 10-2020-0061038 | A | | 6/2020 | |
| KR | 20200061038 | A | * | 6/2020 | ............... G02B 5/20 |
| KR | 10-2002-0015650 | A | | 2/2022 | |

OTHER PUBLICATIONS

International Search Report dated Aug. 1, 2022 for PCT/KR2022/005900.
Japanese Office Action dated Mar. 12, 2024, of the corresponding Japanese Patent Application No. 2023-517889.

* cited by examiner

*Primary Examiner* — Jonathan Johnson
*Assistant Examiner* — Alexander N. Lee
(74) *Attorney, Agent, or Firm* — Lee IP Law, P.C.

(57) ABSTRACT

Provided are a compound represented by a specific chemical formula, a photosensitive resin composition including same, a photosensitive resin film prepared using the photosensitive resin composition, a color filter including the photosensitive resin film and a CMOS image sensor including the color filter.

18 Claims, No Drawings

COMPOUND, PHOTOSENSITIVE RESIN COMPOSITION COMPRISING SAME, PHOTOSENSITIVE RESIN FILM, COLOR FILTER AND CMOS IMAGE SENSOR

CROSS REFERENCE TO RELATED APPLICATIONS

This is the U.S. national phase application based on PCT Application No. PCT/KR2022/005900, filed Apr. 26, 2022, which is based on Korean Patent Application No. 10-2021-0060894, filed May 11, 2021, and Korean Patent Application No. 10-2022-0035509, filed Mar. 22, 2022, the entire contents of all of which are hereby incorporated by reference.

TECHNICAL FIELD

The present disclosure relates to a compound, a photosensitive resin composition including same, a photosensitive resin film prepared using the photosensitive resin composition, a color filter including the photosensitive resin film, and a CMOS image sensor including the color filter.

BACKGROUND ART

A liquid crystal display device among many types of displays has an advantage of lightness, thinness, low cost, low power consumption for operation, and improved adherence to an integrated circuit and has been more widely used for a laptop computer, a monitor, and a TV screen. The liquid crystal display device includes a lower substrate on which a black matrix, a color filter, and an ITO pixel electrode are formed, and an upper substrate on which an active circuit portion including a liquid crystal layer, a thin film transistor, and a capacitor layer and an ITO pixel electrode are formed. Color filters are formed in a pixel region by sequentially stacking a plurality of color filters (in general, formed of a plurality of colors (generally three primary colors of red (R), green (G), and blue (B)) in a predetermined order to form each pixel, and a black matrix layer is disposed in a predetermined pattern on a transparent substrate to form a boundary between the pixels. The pigment dispersion method that is one of methods of forming a color filter provides a colored thin film by repeating a series of processes such as coating a photopolymerizable composition including a colorant on a transparent substrate including a black matrix, exposing a formed pattern to light, removing a non-exposed part with a solvent, and thermally curing the same. A photosensitive resin composition used for manufacturing a color filter according to the pigment dispersion method generally includes an alkali soluble resin, a photopolymerization monomer, a photopolymerization initiator, an epoxy resin, a solvent, other additives, and the like and additionally, an epoxy resin and the like. The pigment dispersion method having the above chrematistics is actively applied to manufacture an LCD such as a mobile phone, a laptop, a monitor, and TV. However, the photosensitive resin composition for a color filter for the pigment dispersion method has recently required improved performance as well as excellent pattern profiles. In particular, there is a growing demand for colorants applicable to image sensors that require high color reproducibility and high luminance and high contrast ratio characteristics.

The image sensors are image sensor parts producing images in a display device such as a cell phone camera, a digital still camera (DSC), and the like and may be classified into charge coupled device (CCD) image sensors and complementary metal oxide semiconductor (CMOS) image sensors.

Since the charge coupled device (CCD) image sensors use a photosensitive resin film for a color filter, which requires a film thickness of less than or equal to 1.5 μm, the photosensitive resin composition should be prepared by including a large amount of the colorants and thus has problems of insufficient adhesion to a substrate or insufficient curing due to deteriorated sensitivity, significant deterioration of pattern formability such as a color loss due to elution of the dyes in an exposed region, and the like. Accordingly, efforts to develop a photosensitive resin composition for a color filter satisfying reliability such as luminance, chemical resistance, and the like and simultaneously, realizing high colors and thus applicable to image sensors are continuously being made.

DISCLOSURE

Description of the Drawings

Technical Problem

An embodiment provides a compound capable of realizing a color filter with improved luminance, contrast ratio, and reliability.

Another embodiment provides a photosensitive resin composition including the compound.

Another embodiment provides a photosensitive resin film manufactured using the photosensitive resin composition.

Another embodiment provides a color filter including the photosensitive resin film.

Another embodiment provides a CMOS image sensor including the color filter.

Technical Solution

An embodiment of the present invention provides a compound represented by Chemical Formula 1.

[Chemical Formula 1]

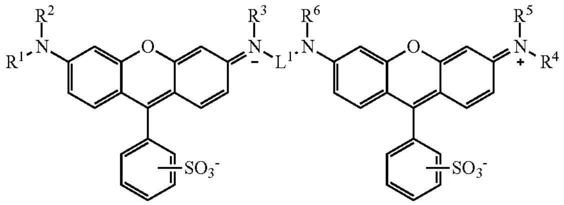

In Chemical Formula 1, $R^1$ to $R^6$ are each independently a hydrogen atom, a halogen atom, a substituted or unsubstituted C1 to C20 alkyl group, or a substituted or unsubstituted C6 to C20 aryl group, one of $R^1$ to $R^3$ is represented by Chemical Formula 2 and the other two are different from this, one of $R^4$ to $R^6$ is represented by Chemical Formula 2 and the other two are different from this, and $L^1$ is a substituted or unsubstituted C3 to C10 alkylene group,

[Chemical Formula 2]

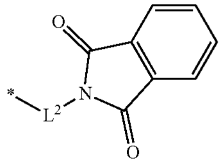

wherein, in Chemical Formula 2, $L^2$ is a substituted or unsubstituted C2 to C20 alkylene group.

In Chemical Formula 1, one of $R^1$ to $R^3$ may be represented by Chemical Formula 2 and the other two may be an unsubstituted C1 to C20 alkyl group or a substituted or unsubstituted C6 to C20 aryl group.

In Chemical Formula 1, $R^1$ may be represented by Chemical Formula 2 and $R^2$ and $R^3$ may each independently be an unsubstituted C1 to C20 alkyl group or a substituted or unsubstituted C6 to C20 aryl group.

In Chemical Formula 1, $R^3$ may be represented by Chemical Formula 2 and $R^1$ and $R^2$ may each independently be an unsubstituted C1 to C20 alkyl group or a substituted or unsubstituted C6 to C20 aryl group.

In Chemical Formula 1, one of $R^4$ to $R^6$ may be represented by Chemical Formula 2 and the other two may be an unsubstituted C1 to C20 alkyl group or a substituted or unsubstituted C6 to C20 aryl group.

In Chemical Formula 1, $R^4$ may be represented by Chemical Formula 2 and $R^5$ and $R^6$ may each independently be an unsubstituted C1 to C20 alkyl group or a substituted or unsubstituted C6 to C20 aryl group.

In Chemical Formula 1, $R^6$ may be represented by Chemical Formula 2 $R^4$ and $R^5$ may each independently be an unsubstituted C1 to C20 alkyl group or a substituted or unsubstituted C6 to C20 aryl group.

The compound represented by Chemical Formula 1 may be represented by any one of Chemical Formula 1-1 to Chemical Formula 1-5.

[Chemical Formula 1-1]

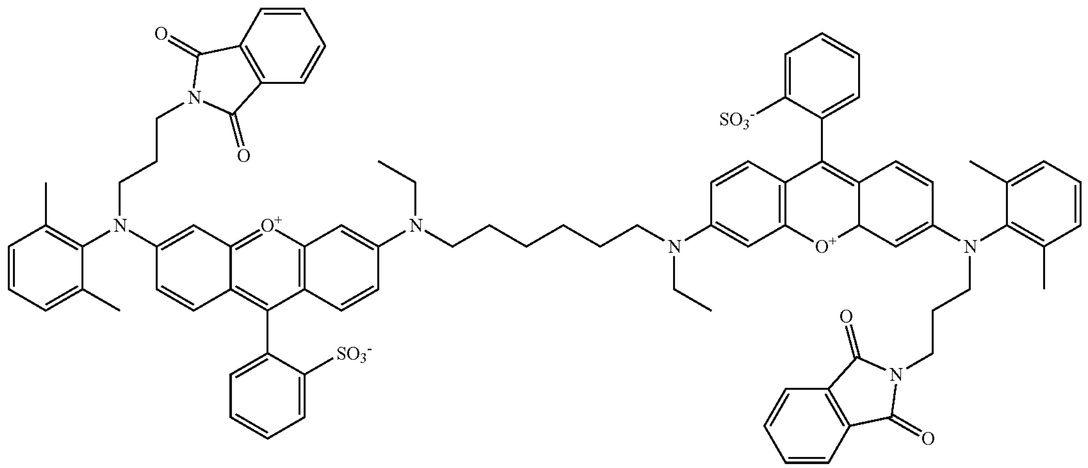

[Chemical Formula 1-2]

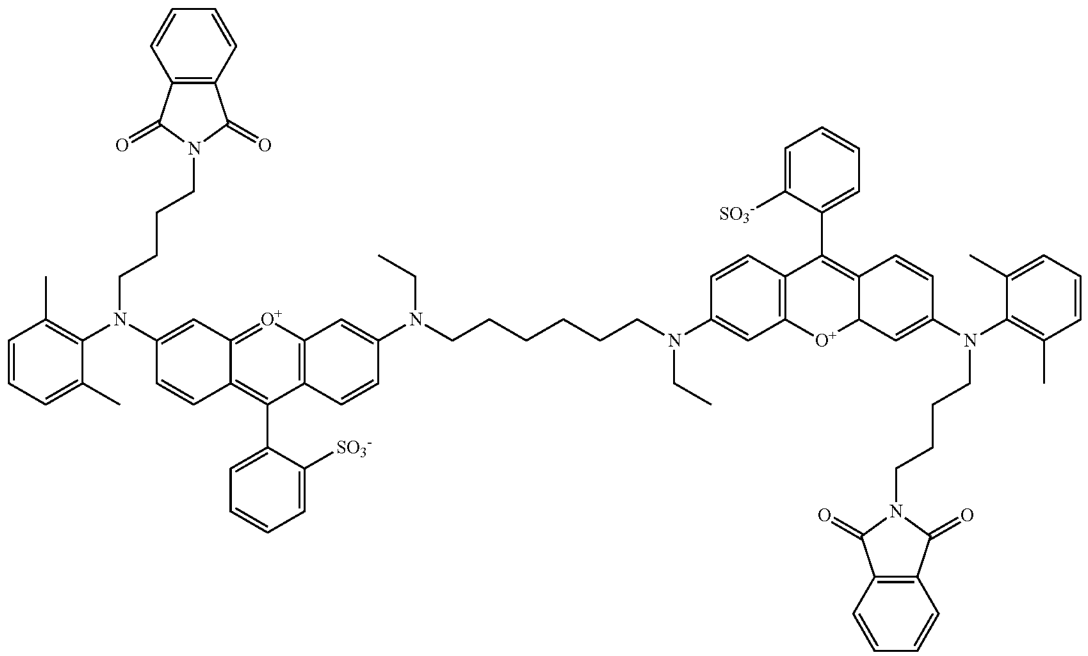

-continued

[Chemical Formula 1-3]

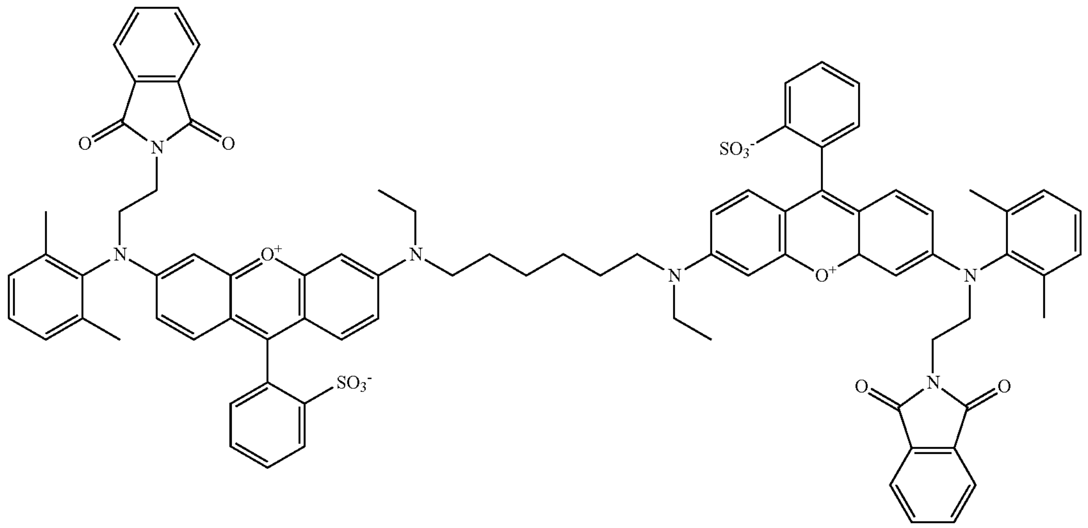

[Chemical Formula 1-4]

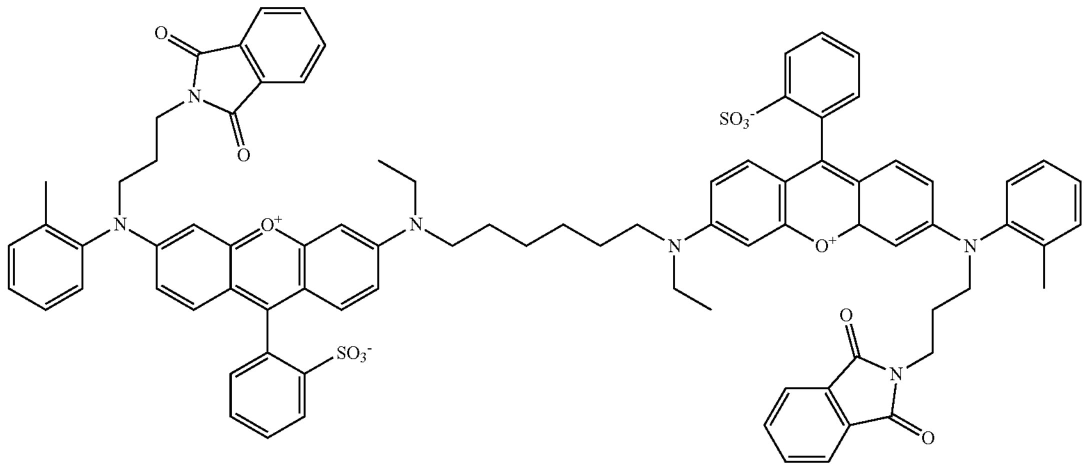

[Chemical Formula 1-5]

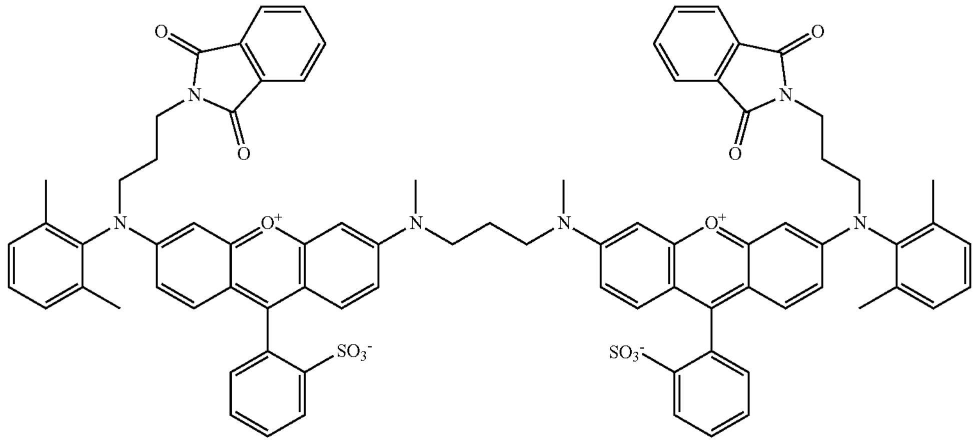

The compound may be a red dye.

Another embodiment provides a photosensitive resin composition including the compound.

The compound may be included in an amount of 7 wt % to 16 wt % based on the total amount of solids constituting the photosensitive resin composition.

The photosensitive resin composition may further include a binder resin, a photopolymerizable compound, a photopolymerization initiator, and a solvent.

The photosensitive resin composition may further include a pigment.

The photosensitive resin composition may include malonic acid; 3-amino-1,2-propanediol; a leveling agent; a fluorine-based surfactant; or a combination thereof.

The photosensitive resin composition may be used for a CMOS image sensor.

Another embodiment provides a photosensitive resin film prepared using the photosensitive resin composition.

Another embodiment provides a color filter including the photosensitive resin film.

Another embodiment provides a CMOS image sensor including the color filter.

Other embodiments of the present invention are included in the following detailed description.

Advantageous Effects

The compound according to an embodiment has excellent red spectral characteristics and may be used as a dye when preparing a photosensitive resin composition for a red color filter, and a photosensitive resin film manufactured using the photosensitive resin composition including the dye, a color filter, and a CMOS image sensor including the same may have excellent brightness, contrast ratio, and durability, and high reliability.

MODE FOR INVENTION

Hereinafter, embodiments of the present invention are described in detail. However, these embodiments are exemplary, the present invention is not limited thereto and the present invention is defined by the scope of claims.

In the present specification, when specific definition is not otherwise provided, "substituted" refers to one substituted with a substituent selected from a halogen (F, Cl, Br, or I), a hydroxy group, a nitro group, a cyano group, an amino group ($NH_2$, $NH(R^{200})$ or $N(R^{201})(R^{202}$ wherein $R^{200}$, $R^{201}$, and $R^{202}$ are the same or different, and are independently a C1 to C10 alkyl group), an amidino group, a hydrazine group, a hydrazone group, a carboxyl group, a substituted or unsubstituted alkyl group, a substituted or unsubstituted alkenyl group, a substituted or unsubstituted alkynyl group, a substituted or unsubstituted alicyclic organic group, a substituted or unsubstituted aryl group, and a substituted or unsubstituted heterocyclic group.

In the present specification, when specific definition is not otherwise provided, "alkyl group" refers to a C1 to C20 alkyl group, and specifically a C1 to C15 alkyl group, "cycloalkyl group" refers to a C3 to C20 cycloalkyl group, and specifically a C3 to C18 cycloalkyl group, "alkoxy group" refers to a C1 to C20 alkoxy group, and specifically a C1 to C18 alkoxy group, "aryl group" refers to a C6 to C20 aryl group, and specifically a C6 to C18 aryl group, "alkenyl group" refers to a C2 to C20 alkenyl group, and specifically a C2 to C18 alkenyl group, "alkylene group" refers to a C1 to C20 alkylene group, and specifically C1 to C18 alkylene group, and "arylene group" refers to a C6 to C20 arylene group, and specifically a C6 to C16 arylene group.

In the present specification, when specific definition is not otherwise provided, "(meth)acrylate" refers to "acrylate" and "methacrylate" and "(meth)acrylic acid" refers to "acrylic acid" and "methacrylic acid."

In the present specification, when a definition is not otherwise provided, the term "combination" refers to mixing or copolymerization. In addition, "copolymerization" refers to block copolymerization to random copolymerization, and "copolymer" refers to a block copolymer to a random copolymer.

In the chemical formula of the present specification, unless a specific definition is otherwise provided, hydrogen is boned at the position when a chemical bond is not drawn where supposed to be given.

In the present specification, when specific definition is not otherwise provided, "*" indicates a point where the same or different atom or chemical formula is linked.

An embodiment provides a compound represented by Chemical Formula 1.

[Chemical Formula 1]

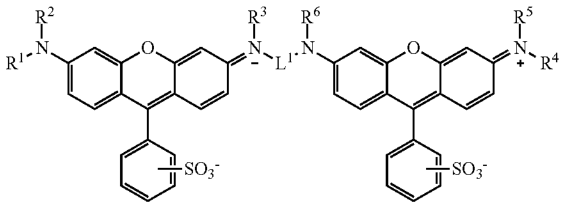

In Chemical Formula 1, $R^1$ to $R^6$ are each independently a hydrogen atom, a halogen atom, a substituted or unsubstituted C1 to C20 alkyl group, or a substituted or unsubstituted C6 to C20 aryl group, one of $R^1$ to $R^3$ is represented by Chemical Formula 2 and the other two are different from this, one of $R^4$ to $R^6$ is represented by Chemical Formula 2 and the other two are different from this, and $L^1$ is a substituted or unsubstituted C3 to C10 alkylene group,

[Chemical Formula 2]

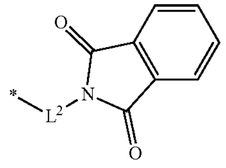

In Chemical Formula 2, $L^2$ is a substituted or unsubstituted C2 to C20 alkylene group.

Since a color filter formed of a photosensitive resin composition using a pigment as a colorant has a limit in terms of luminance and a contrast ratio due to particle sizes of the pigment, the need to improve the luminance and the contrast ratio is constantly being raised. Accordingly, efforts to prepare a photosensitive resin composition appropriate for a dye by introducing the dye not forming particles instead of the pigment and thus implement a color filter with improved luminance and contrast ratio are continuously being made and as a result, the photosensitive resin composition using the dye instead of the pigment as a main colorant has some effects on improving the luminance and the contrast ratio.

On the other hand, the demand for photosensitive resin compositions applicable to charge coupled devices (CCD), complementary metal-oxide semiconductor image sensor, or the like in addition to conventional display devices such as LCD have recently been rapidly increasing. However, a conventional photosensitive resin composition using a dye as a main colorant may not realize high colors when applied to the image sensors and hardly provide a high definition color filter. The reason of not realizing the high colors is that color filters mounted on the charge coupled device (CCD) have 1/100 times to 1/200 times smaller pattern size than those of the conventional color filters for LCD.

Accordingly, the inventors of the present invention, after long research, have developed a dye compound used in a photosensitive resin composition for a color filter capable of realizing high colors by modifying the structure of the xanthene-based compound as shown in Chemical Formula 1, so that the compound may be easily applied to patterns having 100 times to 200 times smaller size than color filter patterns for LCD to increase resolution but reduce residues.

For example, Since the compound represented by Chemical Formula 1 has a dimer structure linked by a substituted or unsubstituted C3 to C10 alkylene group, and has only one substituent represented by Chemical Formula 2 on both sides of the dimer structure, there is a big difference in that the compound has excellent solubility in organic solvents and excellent luminance and chemical resistance of the photosensitive resin composition including it as a colorant, compared to xanthene-based compounds of other structures. That is, by specifically controlling the structure of the xanthene-based compound, the compound according to an embodiment has excellent red spectral characteristics and a high molar extinction coefficient compared to conventional xanthene-based compounds, to provide a photosensitive resin composition having more improved color characteristics such as luminance and contrast ratio and chemical resistance.

For example, in Chemical Formula 1, $L^1$ may be a substituted or unsubstituted C3 to C10 alkylene group, for example a substituted or unsubstituted C3 to C8 alkylene group, for example a substituted or unsubstituted C3 to C6 alkylene group. Even if $L^1$ is an alkylene group, controlling its length is important in terms of color characteristics and chemical resistance. For example, when the $L^1$ is a substituted or unsubstituted ethylene group (C2), a length of the linking group constituting the dimer structure is too short, and thus color characteristics (especially luminance) and chemical resistance may be inferior, and when the $L^1$ is a substituted or unsubstituted C11 alkylene group, a length of the linking group constituting the dimer structure is too long, and thus chemical resistance may be inferior and color characteristics may not be improved.

For example, in Chemical Formula 1, one of $R^1$ to $R^3$ may be represented by Chemical Formula 2, and the other two may be an unsubstituted C1 to C20 alkyl group or a substituted or unsubstituted C6 to C20 aryl group. In this case, it is not difficult to use the compound represented by Chemical Formula 1 as a colorant in the photosensitive resin composition for color filters, and it can be easily implemented in a high color reproduction image sensor.

For example, in Chemical Formula 1, $R^1$ may be represented by Chemical Formula 2, and $R^2$ and $R^3$ may each independently be an unsubstituted C1 to C20 alkyl group or a substituted or unsubstituted C6 to C20 aryl group. For example, in Chemical Formula 1, $R^3$ may be represented by Chemical Formula 2 and $R^1$ and $R^2$ are each independently an unsubstituted C1 to C20 alkyl group or a substituted or unsubstituted C6 to C20 aryl group. In Chemical Formula 1, when the definitions of $R^1$ to $R^3$ are as described above, it is easy to implement a red pixel, solubility in an organic solvent can be further improved, and it may be advantageous in terms of improving luminance and securing process characteristics.

For example, in Chemical Formula 1, one of $R^4$ to $R^6$ may be represented by Chemical Formula 2, and the other two may be an unsubstituted C1 to C20 alkyl group or a substituted or unsubstituted C6 to C20 aryl group. For example, in Chemical Formula 1, $R^4$ may be represented by Chemical Formula 2 and $R^5$ and $R^6$ may each independently be an unsubstituted C1 to C20 alkyl group or a substituted or unsubstituted C6 to C20 aryl group. For example, in Chemical Formula 1, $R^6$ may be represented by Chemical Formula 2 and $R^4$ and $R^5$ may each independently be an unsubstituted C1 to C20 alkyl group or a substituted or unsubstituted C6 to C20 aryl group. In Chemical Formula 1, when the definitions of $R^4$ to $R^6$ are as described above it is easy to implement a red pixel, solubility in an organic solvent can be further improved, and it may be advantageous in terms of improving luminance and securing process characteristics.

Above all, even if a xanthene-based compound of the same series does not have the structure represented by Chemical Formula 1, the photosensitive resin composition including such a xanthene-based compound as a colorant has greatly reduced luminance and chemical resistance or cannot realize high color. That is, since the xanthene-based compound according to an embodiment has a structure represented by Chemical Formula 1, it is different from conventional xanthene-based compounds in terms of structure and spectroscopy.

For example, the compound represented by Chemical Formula 1 may be represented by any one of Chemical Formula 1-1 to Chemical Formula 1-5, but is not necessarily limited thereto.

[Chemical Formula 1-1]
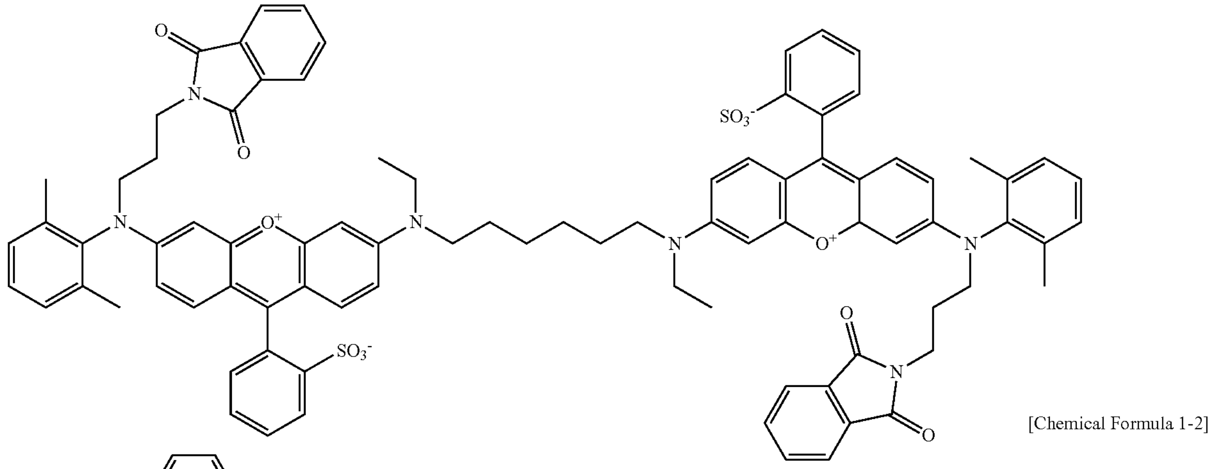
[Chemical Formula 1-2]
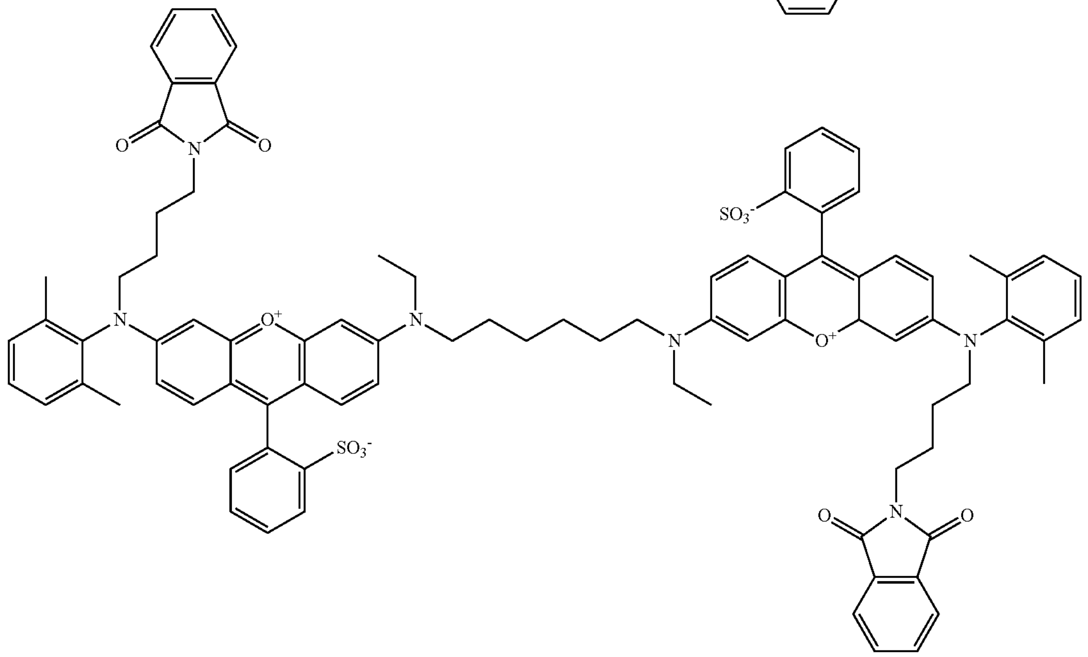
[Chemical Formula 1-3]
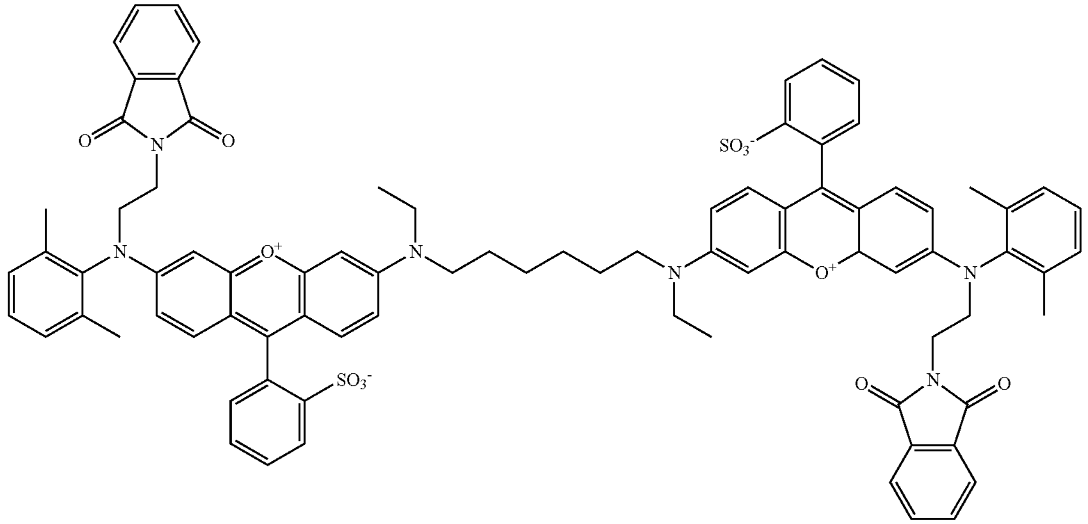

-continued

[Chemical Formula 1-4]

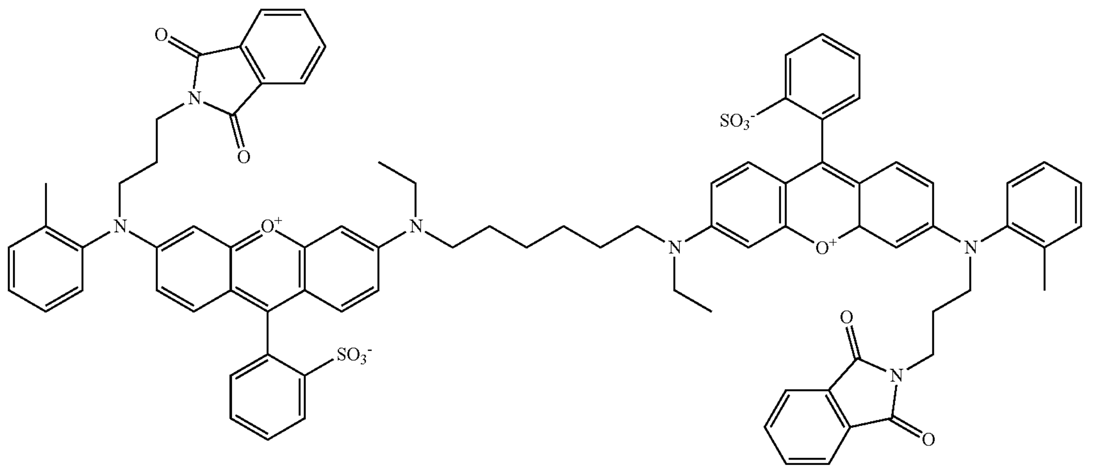

[Chemical Formula 1-5]

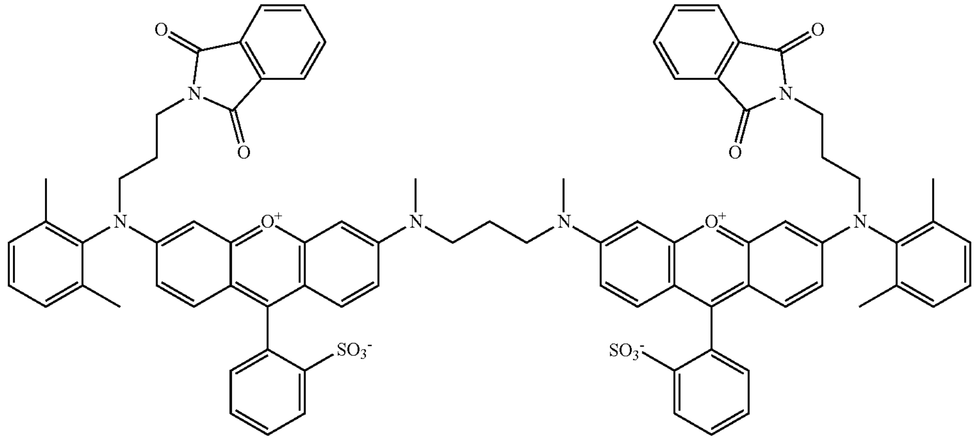

For example, the compound represented by Chemical Formula 1 may express more vivid colors even in a small amount, and when used as a colorant, it is possible to manufacture a display device having excellent color characteristics such as luminance and contrast ratio. For example, the compound may be a colorant, for example a dye, for example a red dye.

In general, a dye is the most expensive among the components used in a color filter. Accordingly, the expensive dye may need to be more used to accomplish a desired effect, for example, high luminance, a high contrast ratio or the like and thus, increase the unit cost of production. However, when the compound according to an embodiment is used as a dye in a color filter, the compound may accomplish excellent color characteristics such as high luminance, a high contrast ratio and the like and reduce the unit cost of production even though used in a small amount.

According to another embodiment, a photosensitive resin composition including the compound according to the embodiment is provided.

For example, the photosensitive resin composition may include the compound according to the embodiment, a binder resin, a photopolymerizable compound, a photopolymerization initiator, and a solvent.

The compound according to an embodiment may serve as a colorant, for example a dye, such as a red dye, in the photosensitive resin composition, and thus may exhibit excellent color characteristics.

The compound according to an embodiment may be included in an amount of 5 wt % to 20 wt %, for example 6 wt % to 19 wt %, for example 7 wt % to 18 wt %, for example 7 wt % to 17 wt %, for example 7 wt % to 16 wt % based on the total amount of solids constituting the photosensitive resin composition. When the compound according to the embodiment is included in the above range, color reproducibility and contrast ratio are improved.

The photosensitive resin composition may further include a pigment, for example a yellow pigment, a red pigment, or a combination thereof.

The yellow pigment may be C.I. pigment yellow 138, C.I. pigment yellow 139, C.I. pigment yellow 150, and the like in a color index, which may be used alone or as a mixture of two or more.

The red pigment may include a perylene-based pigment, an anthraquinone-based pigment, an azo-based pigment, a diazo-based pigment, a quinacridone-based pigment, an anthracene-based pigment, and the like. Specific examples of the red pigment may be a perylene pigment, a quinacridone pigment, naphthol AS, a sicomin pigment, an anthraquinone (sudan I, II, III, R), dianthraquinonylate, vis azo, benzopyrane, and the like.

The pigment may be included in a form of pigment dispersion in the photosensitive resin composition.

The pigment dispersion may include a solid pigment, a solvent, and a dispersing agent in order to disperse the pigment in the solvent uniformly.

The pigment may be included in a solid content of 1 wt % to 20 wt %, for example 8 wt % to 20 wt %, for example 8 wt % to 15 wt %, for example 10 wt % to 20 wt %, for example 10 wt % to 15 wt % based on the total amount of pigment dispersion.

The dispersing agent may be a non-ionic dispersing agent, an anionic dispersing agent, a cationic dispersing agent, and the like. Specific examples of the dispersing agent may be polyalkylene glycol and esters thereof, polyoxyalkylene, polyhydric alcohol ester alkylene oxide addition product, an alcohol alkylene oxide addition product, sulfonate ester, sulfonate salt, a carboxylate ester, a carboxylate salt, an alkylamide alkylene oxide addition product, alkyl amine, and the like, and may be used alone or as a mixture of two or more.

Commercially available examples of the dispersing agent may include DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, and the like made by BYK Co., Ltd.; EFKA-47, EFKA-47EA, EFKA-48, EFKA-49, EFKA-100, EFKA-400, EFKA-450, and the like made by EFKA Chemicals Co.; Solsperse 5000, Solsperse 12000, Solsperse 13240, Solsperse 13940, Solsperse 17000, Solsperse 20000, Solsperse 24000GR, Solsperse 27000, Solsperse 28000, and the like made by Zeneka Co.; or PB711, or PB821 made by Ajinomoto Inc.

The dispersing agent may be included in an amount of 1 wt % to 20 wt % based on the total amount of the pigment dispersion. When the dispersing agent is included within the range, dispersion of a photosensitive resin composition is improved due to an appropriate viscosity, and thus optical, physical and chemical quality may be maintained when the photosensitive resin composition is applied to products.

A solvent for forming the pigment dispersion may be ethylene glycol acetate, ethylcellosolve, propylene glycol methylether acetate, ethyllactate, polyethylene glycol, cyclohexanone, propylene glycol methylether, and the like.

The pigment dispersion may be included in an amount of 10 wt % to 20 wt %, for example 12 wt % to 18 wt % based on the total amount of the photosensitive resin composition. When the pigment dispersion is included within the range, a process margin may be desirably ensured, and color reproducibility and a contrast ratio are improved.

The binder resin may be an acryl-based resin.

The acryl-based resin is a copolymer of a first ethylenic unsaturated monomer and a second ethylenic unsaturated monomer that is copolymerizable therewith, and is a resin including at least one acryl-based repeating unit.

The first ethylenic unsaturated monomer is an ethylenic unsaturated monomer including at least one carboxyl group. Examples of the monomer include (meth)acrylic acid, maleic acid, itaconic acid, fumaric acid, or a combination thereof.

The first ethylenic unsaturated monomer may be included in an amount of 5 wt % to 50 wt %, for example 10 wt % to 40 wt % based on the total amount of the acryl-based binder resin.

The second ethylenic unsaturated monomer may be an aromatic vinyl compound such as styrene, α-methylstyrene, vinyl toluene, vinylbenzylmethylether and the like; an unsaturated carboxylate ester compound such as methyl (meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; an unsaturated amino alkyl carboxylate ester compound such as 2-aminoethyl(meth)acrylate, 2-dimethylaminoethyl(meth)acrylate, and the like; a carboxylic acid vinyl ester compound such as vinyl acetate, vinyl benzoate, and the like; an unsaturated glycidyl carboxylate ester compound such as glycidyl(meth)acrylate, and the like; a vinyl cyanide compound such as (meth)acrylonitrile and the like; an unsaturated amide compound such as (meth)acrylamide, and the like; and the like, and may be used alone or as a mixture of two or more.

Specific examples of the acryl-based resin may be a (meth)acrylic acid/benzylmethacrylate copolymer, a (meth)acrylic acid/benzylmethacrylate copolymer, a (meth)acrylic acid/benzylmethacrylate/styrene copolymer, a (meth)acrylic acid/benzylmethacrylate/2-hydroxyethylmethacrylate copolymer, a (meth)acrylic acid/benzylmethacrylate/styrene/2-hydroxyethylmethacrylate copolymer, and the like, but are not limited thereto and these may be used alone or as a mixture of two or more.

For example, the binder resin may further include an epoxy-based resin together with the acryl-based resin.

A weight average molecular weight of the binder resin may be 3,000 g/mol to 150,000 g/mol, for example 5,000 g/mol to 50,000 g/mol, for example 20,000 g/mol to 30,000 g/mol. When the binder resin has a weight average molecular weight within the range, the photosensitive resin composition has good physical and chemical properties, appropriate viscosity, and close contacting properties with a substrate during manufacture of a color filter.

An acid value of the binder resin may be 15 mgKOH/g to 60 mgKOH/g, for example 20 mgKOH/g to 50 mgKOH/g. When the acid value of the binder resin is within the ranges, resolution of pixel patterns is improved.

The binder resin may be included in an amount of 1 wt % to 20 wt %, for example 1 wt % to 15 wt %, for example 1 wt % to 10 wt % based on the total amount of the photosensitive resin composition. When the binder resin is included within the above range, developability may be improved and excellent surface smoothness may be improved due to improved cross-linking during the production of a color filter.

The photopolymerizable compound may be mono-functional or multi-functional ester of (meth)acrylic acid including at least one ethylenic unsaturated double bond.

The photopolymerizable compound has the ethylenic unsaturated double bond and thus, may cause sufficient polymerization during exposure in a pattern-forming process and form a pattern having excellent heat resistance, light resistance, and chemical resistance.

Specific examples of the photopolymerizable compound may be ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy(meth)acrylate, ethylene glycol monomethylether (meth)acrylate, trimethylol propane tri(meth)acrylate, tris(meth)acryloyloxyethyl phosphate, novolac epoxy (meth)acrylate, and the like.

Commercially available examples of the photopolymerizable compound are as follows. Examples of the mono-functional ester of (meth)acrylic acid may include Aronix M-101®, M-111®, M-114® (Toagosei Chemistry Industry Co., Ltd.); KAYARAD TC-110S®, TC-120S® (Nippon Kayaku Co., Ltd.); V-158®, V-2311® (Osaka Organic Chemical Ind., Ltd.), and the like. Examples of a di-functional ester of (meth)acrylic acid may include Aronix M-210®, M-240®, M-6200® (Toagosei Chemistry Industry Co., Ltd.), KAYARAD HDDA®, HX-220®, R-604® (Nippon Kayaku Co., Ltd.), V-260®, V-312®, V-335 HP® (Osaka Organic Chemical Ind., Ltd.), and the like. Examples of a tri-functional ester of (meth)acrylic acid may include Aronix M-309®, M-400®, M-405®, M-450®, M-710®, M-8030®, M-8060® (Toagosei Chemistry Industry Co., Ltd.), KAYARAD TMPTA®, DPCA-20®, DPCA-30®, DPCA-60®, DPCA-120® (Nippon Kayaku Co., Ltd.), V-295®, V-300®, V-360®, V-GPT®, V-3PA®, V-400® (Osaka Yuki Kayaku Kogyo Co. Ltd.), and the like. These may be used alone or as a mixture of two or more.

The photopolymerizable compound may be treated with acid anhydride to improve developability.

The photopolymerizable compound may be included in an amount of 1 wt % to 15 wt %, for example 1 wt % to 10 wt % based on the total amount of the photosensitive resin composition. When the photopolymerizable compound is included within the range, the photopolymerizable compound is sufficiently cured during exposure in a pattern-forming process and has excellent reliability, and developability for alkali developing solution may be improved.

The photopolymerization initiator is a generally-used initiator for a photosensitive resin composition, for example an acetophenone-based compound, a benzophenone-based compound, a thioxanthone-based compound, a benzoin-based compound, a triazine-based compound, an oxime-based compound, or a combination thereof.

Examples of the acetophenone-based compound may be 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone-based compound may be benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylamino-benzophenone, 4,4'-dichlorobenzophenone, 3,3'-dimethyl-2-methoxybenzophenone, and the like.

Examples of the thioxanthone-based compound may be thioxanthone, 2-methylthioxanthone, isopropyl thioxanthone, 2,4-diethyl thioxanthone, 2,4-diisopropyl thioxanthone, 2-chlorothioxanthone, and the like.

Examples of the benzoin-based compound may be benzoin, benzoin methyl ether, benzoin ethyl ether, benzoin isopropyl ether, benzoin isobutyl ether, benzyldimethyl ketal, and the like.

Examples of the triazine-based compound may be 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine,2-(p-methoxyphenyl)-4,6-bis(trichloromethyl)-s-triazine, 2-(p-tolyl)-4,6-bis(trichloromethyl)-s-triazine, 2-biphenyl 4,6-bis(trichloromethyl)-s-triazine, bis(trichloromethyl)-6-styryl-s-triazine, 2-(naphthol-yl)-4,6-bis (trichloromethyl)-s-triazine, 2-(4-methoxynaphthol-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and the like.

Examples of the oxime-based compound may be O-acyloxime-based compound, 2-(o-benzoyloxime)-1-[4-(phenylthio)phenyl]-1,2-octandione, 1-(o-acetyloxime)-1-[9-ethyl-6-(2-methylbenzoyl)-9H-carbazol-3-yl]ethanone, O-ethoxycarbonyl-α-oxyamino-1-phenylpropan-1-one and the like. Specific examples of the O-acyloxime-based compound may be 1,2-octandione, 2-dimethylamino-2-(4-methylbenzyl)-1-(4-morpholin-4-yl-phenyl)-butan-1-one, 1-(4-phenylsulfanyl phenyl)-butane-1,2-dione 2-oxime-O-benzoate, 1-(4-phenylsulfanyl phenyl)-octane-1,2-dione2-oxime-O-benzoate, 1-(4-phenylsulfanyl phenyl)-octan-1-one oxime-O-acetate, 1-(4-phenylsulfanyl phenyl)-butan-1-oneoxime-O-acetate, and the like.

The photopolymerization initiator may further include a carbazole-based compound, a diketone-based compound, a sulfonium borate-based compound, a diazo-based compound, an imidazole-based compound, a biimidazole-based compound, a fluorene-based compound, and the like besides the compounds.

The photopolymerization initiator may be used with a photosensitizer capable of causing a chemical reaction by absorbing light and becoming excited and then, transferring its energy.

Examples of the photosensitizer may be tetraethylene glycol bis-3-mercapto propionate, pentaerythritol tetrakis-3-mercapto propionate, dipentaerythritol tetrakis-3-mercapto propionate, and the like.

The photopolymerization initiator may be included in an amount of 0.01 wt % to 10 wt %, for example 0.1 wt % to 5 wt % based on the total amount of the photosensitive resin composition. When the photopolymerization initiator is included within the range, excellent reliability may be secured due to sufficiently curing during exposure in a pattern-forming process, a pattern may have excellent resolution and close-contacting properties as well as excellent heat resistance, light resistance, and chemical resistance, and transmittance may be prevented from deterioration due to a non-reaction initiator.

The solvent is a material having compatibility with the compound according to an embodiment, the pigment, the binder resin, the photopolymerizable monomer, and the photopolymerization initiator, but not reacting therewith.

Examples of the solvent may include alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactate esters such as methyl lactate, ethyl lactate, and the like; oxy acetic acid alkyl esters such as oxy methyl acetate, oxy ethyl acetate, butyl oxyacetate, and the like;

alkoxy acetic acid alkyl esters such as methoxy methyl acetate, methoxy ethyl acetate, methoxy butyl acetate, ethoxy methyl acetate, ethoxy ethyl acetate, and the like; 3-oxy propionic acid alkyl esters such as 3-oxy methyl propionate, 3-oxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-oxy propionic acid alkyl esters such as 2-oxy methyl propionate, 2-oxy ethyl propionate, 2-oxy propyl propionate, and the like; 2-alkoxy propionic acid alkyl esters such as 2-methoxy methyl propionate, 2-methoxy ethyl propionate, 2-ethoxy ethyl propionate, 2-ethoxy methyl propionate, and the like; 2-oxy-2-methyl propionic acid esters such 2-oxy-2-methyl methyl propionate, 2-oxy-2-methyl ethyl propionate, and the like, monooxy monocarboxylic acid alkyl esters of 2-alkoxy-2-methyl alkyl propionates such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanoate, and the like; ketonate esters such as ethyl pyruvate, and the like. Additionally, high boiling point solvent such as N-methylformamide, N,N-dimethylformamide, N-methylformanilide, N-methylacetamide, N,N-dimethylacetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like may be also used.

Considering miscibility and reactivity, glycol ethers such as ethylene glycol monoethylether, and the like; ethylene glycol alkylether acetates such as ethyl cellosolve acetate, and the like; esters such as 2-hydroxy ethyl propionate, and the like; carbitols such as diethylene glycol monomethylether, and the like; propylene glycol alkylether acetates such as propylene glycol monomethylether acetate, propylene glycol propylether acetate, and the like; and/or ketones such as cyclohexanone may be used.

The solvent may be included in a balance amount, for example 30 wt % to 80 wt % based on the total amount of the photosensitive resin composition. When the solvent is included within the range, the photosensitive resin composition may have an appropriate viscosity and thus processability is improved during a production of a color filter.

The photosensitive resin composition may further include other additives such as malonic acid; 3-amino-1,2-propanediol; a silane-based coupling agent; a leveling agent; a fluorine-based surfactant; a radical polymerization initiator, or a combination thereof, in order to prevent stains or spots during the coating, to adjust leveling, or to prevent pattern residue due to non-development.

Examples of the silane-based coupling agent may be trimethoxysilyl benzoic acid, γ-methacryl oxypropyl trimethoxysilane, vinyl triacetoxysilane, vinyl trimethoxysilane, γ-isocyanate propyl triethoxysilane, γ-glycidoxy propyl trimethoxysilane, 0-(epoxycyclohexyl)ethyltrimethoxysilane, and the like and may be used alone or in a mixture of two or more.

Examples of the fluorine-based surfactant may be commercial products such as BM-1000®, and BM-1100® (BM Chemie Inc.); MEGAFACE F 142D®, F 172®, F 173®, and F 183® Dainippon Ink Kagaku Kogyo Co., Ltd.); FULORAD FC-135®, FULORAD FC-170C®, FULORAD FC-430®, and FULORAD FC-431® (Sumitomo 3M Co., Ltd.); SURFLON S-112®, SURFLON S-113®, SURFLON S-131®, SURFLON S-141®, and SURFLON S-145® (Asahi Glass Co., Ltd.); and SH-28PA®, SH-190®, SH-193®, SZ-6032®, and SF-8428®, and the like (Toray Silicone Co., Ltd.).

A content of the additives may be easily adjusted according to desired physical properties.

For example, the photosensitive resin composition may be used for a CMOS image sensor.

According to another embodiment, a photosensitive resin film manufactured using the photosensitive resin composition according to the embodiment is provided.

According to another embodiment, a color filter including the photosensitive resin film is provided.

Pattern forming processes in the color filter are as follows.

The process includes coating the photosensitive resin composition on a support substrate in a method of spin coating, slit coating, inkjet printing, and the like; drying the coated photosensitive resin composition to form a photosensitive resin composition layer; exposing the photosensitive resin composition layer to light; developing the exposed photosensitive resin composition layer in an alkali aqueous solution to obtain a photosensitive resin film; and heat-treating the photosensitive resin film. Conditions for the patterning process are well known in a related art and will not be illustrated in detail in the specification.

According to another embodiment, a CMOS image sensor including the color filter is provided.

Hereinafter, the present invention is illustrated in more detail with reference to examples, but these examples, however, are not in any sense to be interpreted as limiting the scope of the invention.

(Synthesis of Compounds)

(Synthesis of Intermediate 1)

[Reaction Scheme 1]

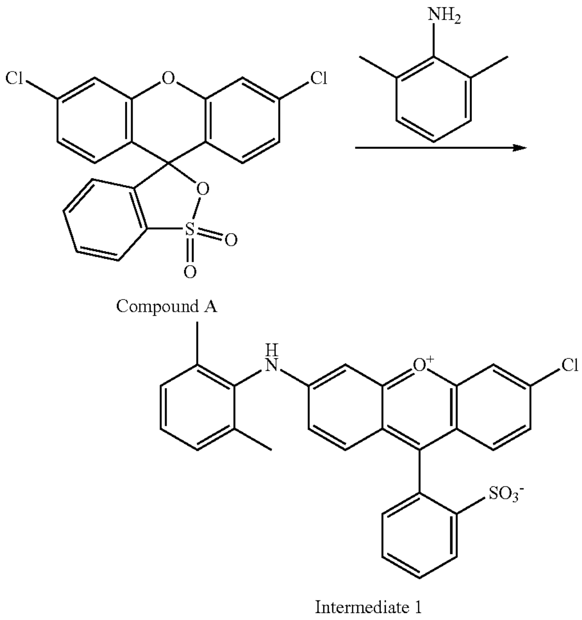

32 g of Compound A (CAS No. 77545-45-0) was put in a reactor and dissolved in 300 g of 2-propanol. 19.1 g of 2,6-dimethylaniline was added thereto and then, stirred at 80° C. for 8 hours. The reactant was cooled, and 2 L of water was added thereto, producing precipitates. The obtained precipitates were suction-filtered and additionally washed with water. A filtrate therefrom was dried, obtaining 31 g (Yield: 80%) of Intermediate 1.

(Synthesis of Intermediate 2)

[Reaction Scheme 2]

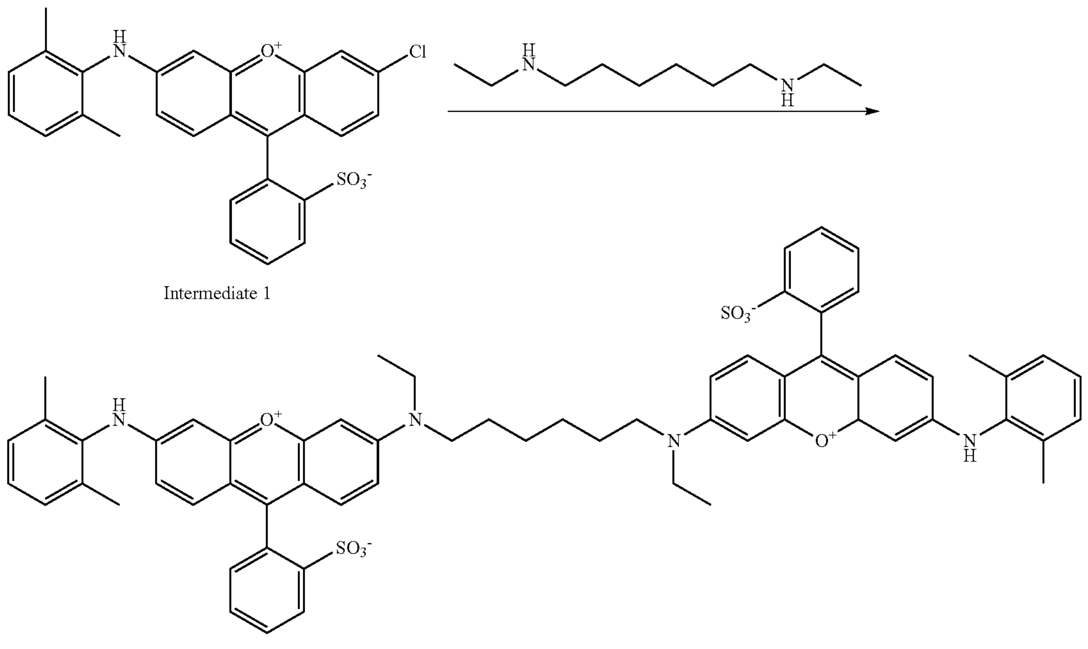

Intermediate 1

Intermediate 2

10 g of Intermediate 1 was put in a reactor, and 30 g of dimethyl formamide and 1.65 g of N,N'-diethyl-1,6-diaminohexane were added thereto and then, stirred at 120° C. for 8 hours. 100 g of dichloromethane was added to the reactant and washed with water. The obtained organic layer was distilled under reduced pressure after silica filtration. The distilled mixture was dissolved in 10 g of dichloromethane and then added in a dropwise fashion to 100 g of normal hexane to precipitate it. The obtained precipitate was suction-filtered and further washed. A filtrate therefrom was dried, obtaining 8.69 g (Yield: 81%) of Intermediate 2.

Synthesis Example 1: Synthesis of Compound Represented by Chemical Formula 1-1

3.0 g of Intermediate 2 was put in a reactor, and 5 g of dimethyl formamide, 1.8 g of N-(3-bromopropyl)phthalimide, 0.9 g of $K_2CO_3$, and 0.11 g of KI were added thereto and then, stirred by heating at 95° C. for 8 hours. 100 g of dichloromethane was added to the reactant and washed with water. The obtained organic layer was distilled under reduced pressure after silica filtration. The distilled mixture was dissolved in 10 g of dichloromethane and then added in a dropwise fashion to 100 g of normal hexane to precipitate it. The obtained precipitate was suction-filtered and further washed. A filtrate therefrom was dried, obtaining 3 g (Yield: 72%) of a compound represented by Chemical Formula 1-1.

[Chemical Formula 1-1]

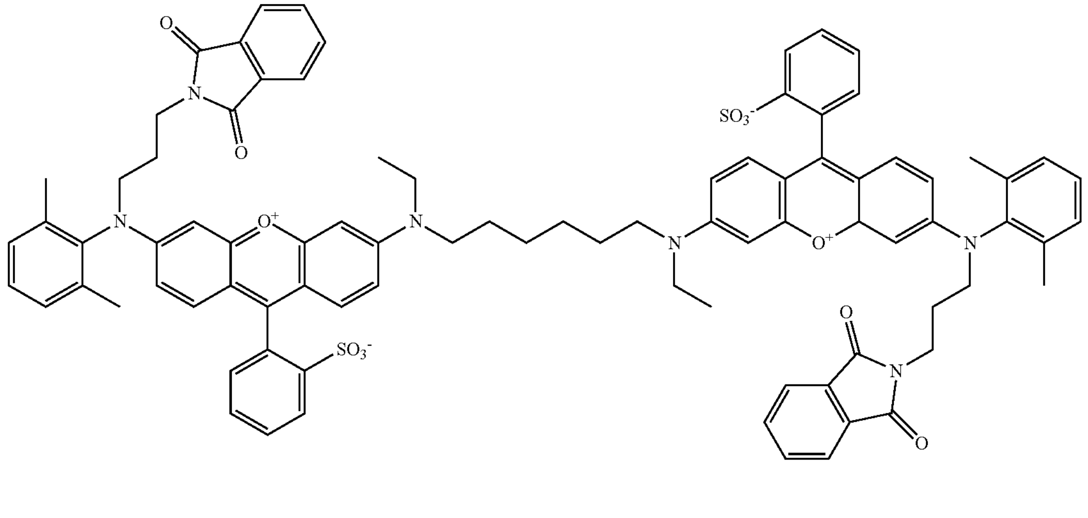

Maldi-tof MS: 1454.72 m/z

Synthesis Example 2: Synthesis of Compound Represented by Chemical Formula 1-2

A compound represented by Chemical Formula 1-2 was obtained in the same manner as in Synthesis Example 1 except that 1.9 g of N-(4-bromobutyl)phthalimide was used instead of 1.8 g of N-(3-bromopropyl)phthalimide.

[Chemical Formula 1-2]

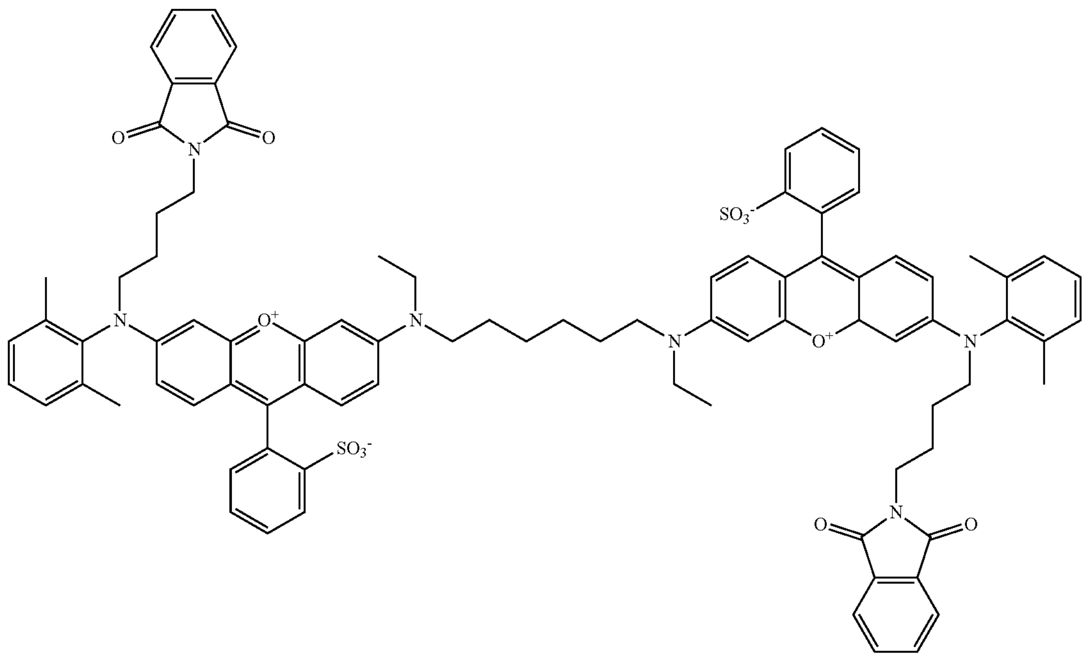

Maldi-tof MS: 1482.77 m/z

Synthesis Example 3: Synthesis of Compound Represented by Chemical Formula 1-3

A compound represented by Chemical Formula 1-2 was obtained in the same manner as in Synthesis Example 1 except that 1.7 g of N-(2-bromoethyl)phthalimide was used instead of 1.8 g of N-(3-bromopropyl)phthalimide.

[Chemical Formula 1-3]

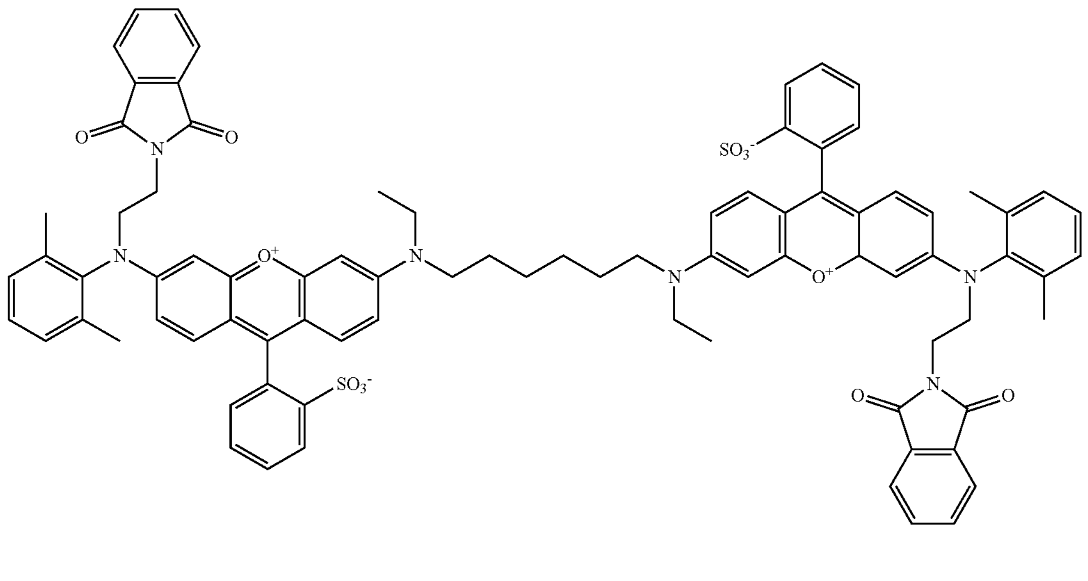

Maldi-tof MS: 1426.67 m/z

Synthesis Example 4: Synthesis of Compound Represented by Chemical Formula 1-4

32 g of Compound A (CAS No. 77545-45-0) was put in a reactor and dissolved in 300 g of 2-propanol. 16.9 g of o-toluidine was added thereto and then, stirred at 80° C. for 8 hours. The reactant was cooled, and 2 L of water was added thereto, producing precipitates. The obtained precipitates were suction-filtered and additionally washed with water. A filtrate therefrom was dried, obtaining 31 g (Yield: 80%) of Intermediate 3.

[Reaction Scheme 3]

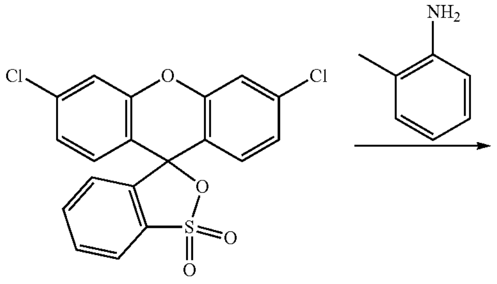

Compound A

-continued

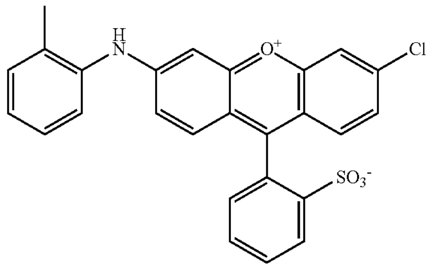

Intermediate 3

32 g of Intermediate 3 was put in a reactor, and 30 g of dimethyl formamide and 1.70 g of N,N'-diethyl-1,6-diaminohexane were added thereto and then, stirred at 120° C. for 8 hours. 100 g of dichloromethane was added to the reactant and washed with water. The obtained organic layer was distilled under reduced pressure after silica filtration. The distilled mixture was dissolved in 10 g of dichloromethane and then added in a dropwise fashion to 100 g of normal hexane to precipitate it. The obtained precipitate was suction-filtered and further washed. A filtrate therefrom was dried, obtaining 8.95 g (Yield: 81%) of Intermediate 4.

[Reaction Scheme 4]

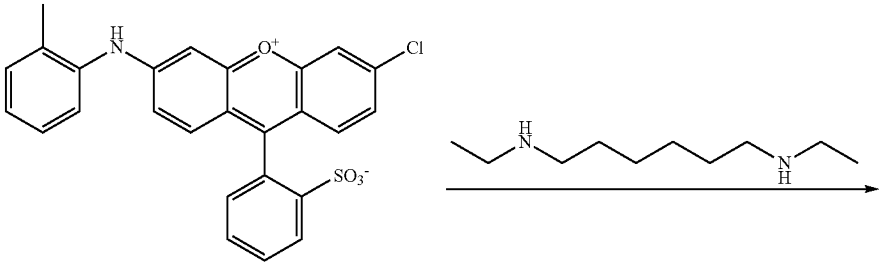

Intermediate 3

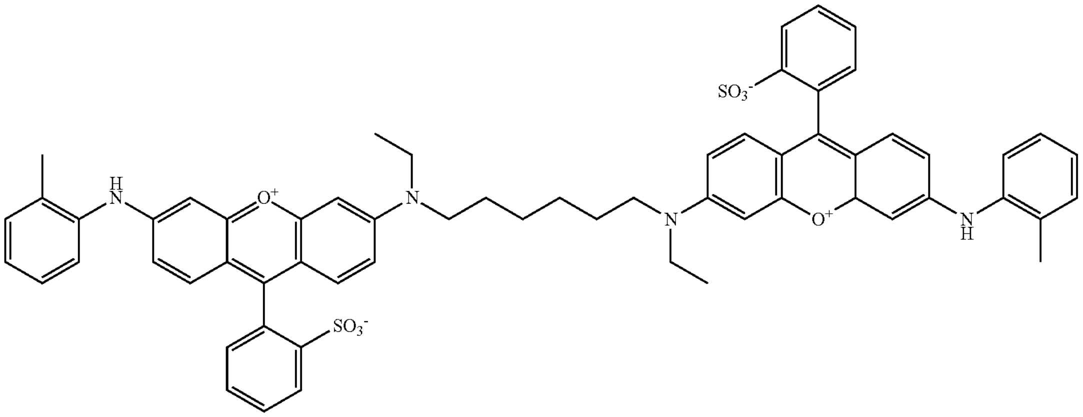

Intermediate 4

3.0 g of Intermediate 4 was put in a reactor, and 5 g of dimethyl formamide, 1.7 g of N-(3-bromopropyl)phthalimide, 0.9 g of K2CO3, and 0.11 g of KI were added thereto and then, stirred by heating at 95° C. for 8 hours. 100 g of dichloromethane was added to the reactant and washed with water. The obtained organic layer was distilled under reduced pressure after silica filtration. The distilled mixture was dissolved in 10 g of dichloromethane and then added in a dropwise fashion to 100 g of normal hexane to precipitate it. The obtained precipitate was suction-filtered and further washed. A filtrate therefrom was dried, obtaining 2.98 g (Yield: 72%) of a compound represented by Chemical Formula 1-4.

[Chemical Formula 1-4]

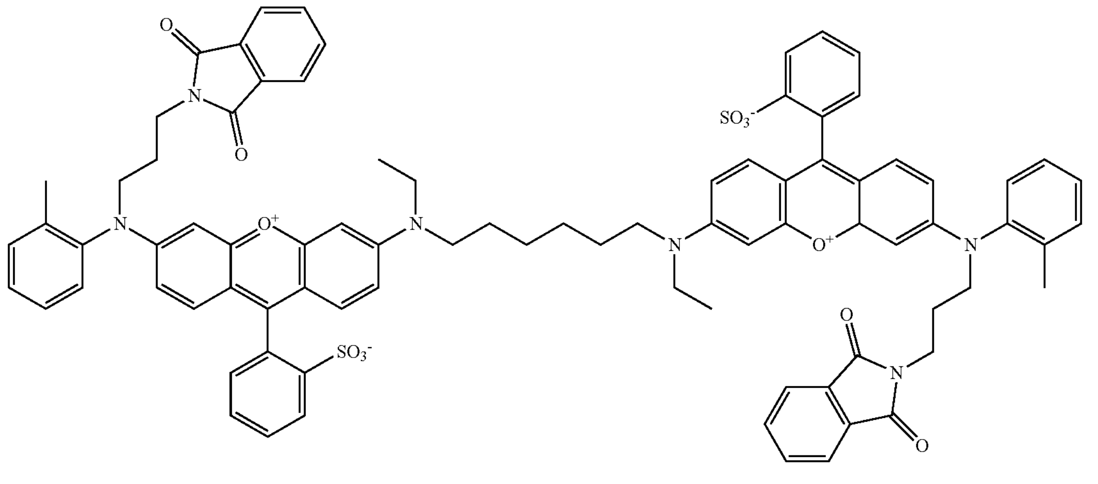

Maldi-tof MS: 1426.67 m/z

Synthesis Example 5: Synthesis of Compound Represented by Chemical Formula 1-5

10 g of Intermediate 1 was put in a reactor, and 30 g of dimethyl formamide and 0.98 g of N,N'-dimethyl-1,3-propanediamine were added thereto and then, stirred at 120° C. for 8 hours. 100 g of dichloromethane was added to the reactant and washed with water. The obtained organic layer was distilled under reduced pressure after silica filtration. The distilled mixture was dissolved in 10 g of dichloromethane and then added in a dropwise fashion to 100 g of normal hexane to precipitate it. The obtained precipitate was suction-filtered and further washed. A filtrate therefrom was dried, obtaining 7.72 g (Yield: 75%) of Intermediate 5.

[Reaction Scheme 5]

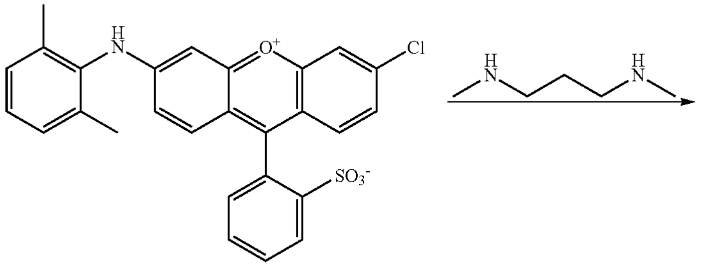

Intermediate 1

-continued

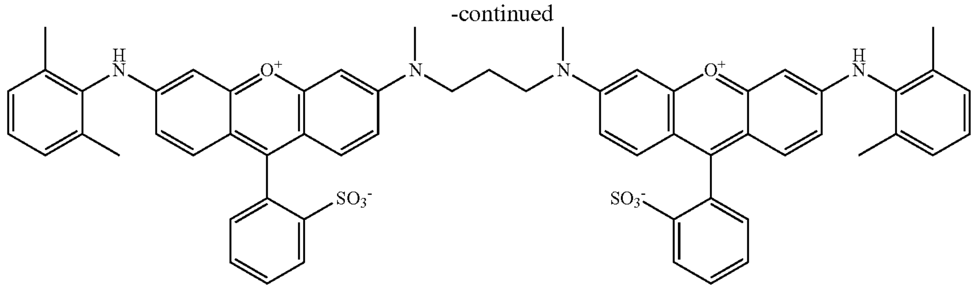

Intermediate 5

3.0 g of Intermediate 5 was put in a reactor, and 5 g of dimethyl formamide, 1.8 g of N-(3-bromopropyl)phthalimide, 0.9 g of $K_2CO_3$, and 0.11 g of KI were added thereto and then, stirred by heating at 95° C. for 8 hours. 100 g of dichloromethane was added to the reactant and washed with water. The obtained organic layer was distilled under reduced pressure after silica filtration. The distilled mixture was dissolved in 10 g of dichloromethane and then added in a dropwise fashion to 100 g of normal hexane to precipitate it. The obtained precipitate was suction-filtered and further washed. A filtrate therefrom was dried, obtaining 2.07 g (Yield: 50%) of a compound represented by Chemical Formula 1-5.

[Chemical Formula 1-5]

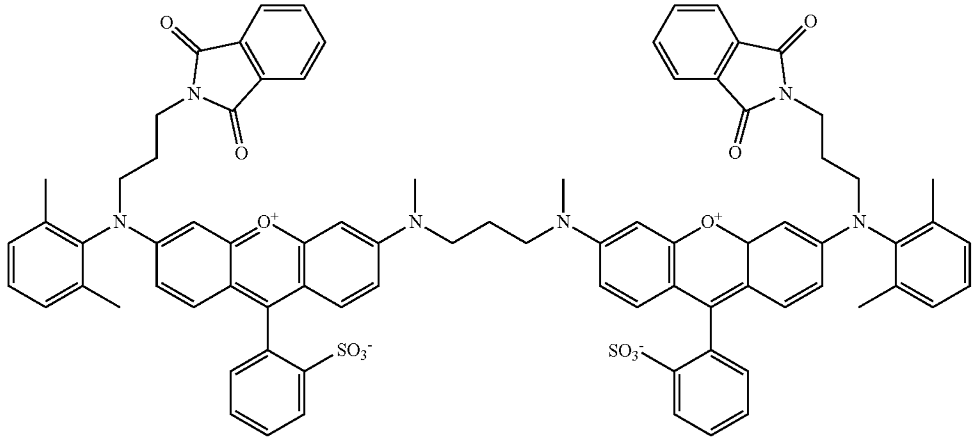

Maldi-tof MS: 1384.59 m/z

Comparative Synthesis Example 1: Synthesis of Compound Represented by Chemical Formula C-1

[Reaction Scheme 6]

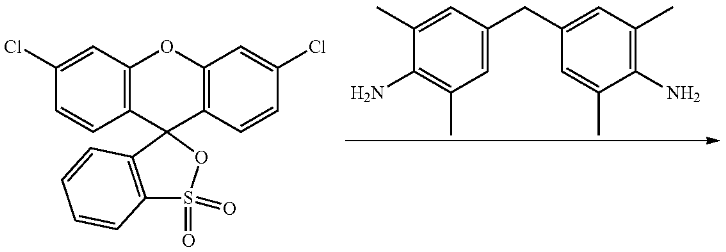

Compound A

-continued

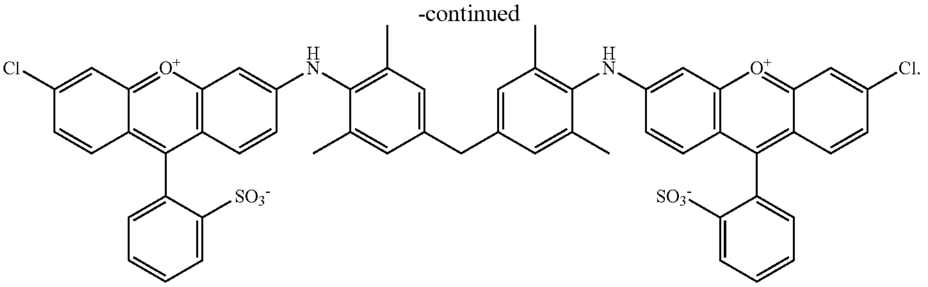

Intermediate 6

32 g of Compound A (CAS No. 77545-45-0) was put in a reactor and dissolved in 300 g of N-methylpyrrolidone (NMP). 8.03 g of 4,4'-methylenebis(2,6-dimethylaniline) was added thereto and then, stirred at 150° C. for 4 hours. The reactant was cooled, and then, 2 L of water was added thereto, producing precipitates. The obtained precipitates was suction-filtered and additionally washed with water. A filtrate therefrom was dried, obtaining 16.29 g (yield: 52%) of Intermediate 6.

[Reaction Scheme 7]

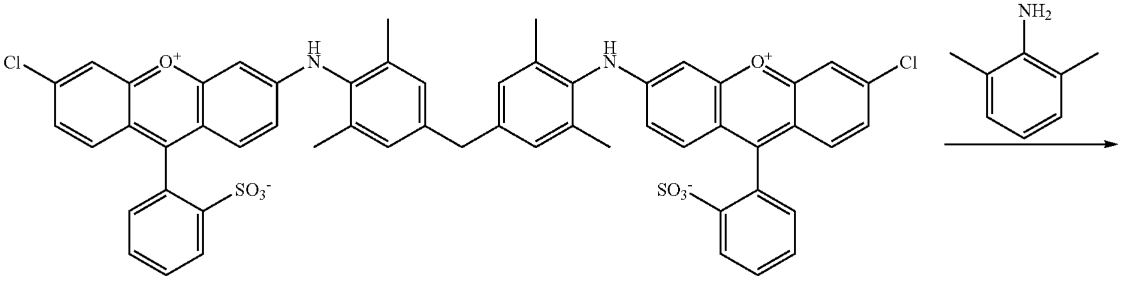

Intermediate 6

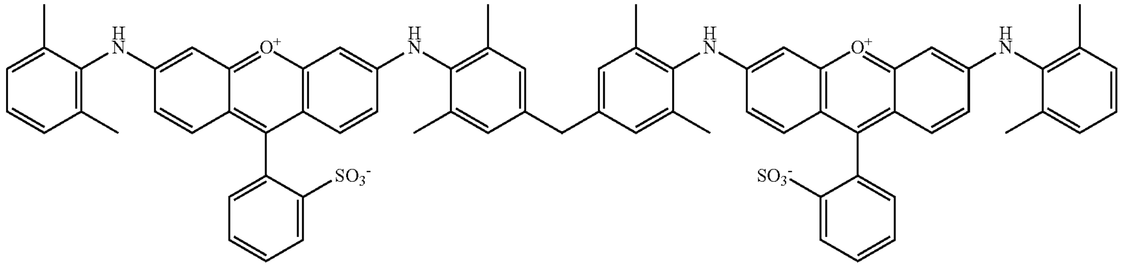

Intermediate 7

10 g of Intermediate 6 was put in a reactor, and 30 g of N-methylpyrrolidone (NMP) and 2.93 g of 2,6-dimethylaniline were added thereto and then, stirred at 150° C. for 5 hours. 100 g of dichloromethane was added to the reactant and washed with water. The obtained organic layer was distilled under reduced pressure after silica filtration. The distilled mixture was dissolved in 10 g of dichloromethane and then added in a dropwise fashion to 100 g of normal hexane to precipitate it. The obtained precipitate was suction-filtered and further washed. A filtrate therefrom was dried, obtaining 5.03 g (Yield: 43%) of Intermediate 7.

3.0 g of Intermediate 7 was put in a reactor, and 5 g of dimethyl formamide, 2.11 g of 1-Iodopropane, and 1.71 g of K2CO3 were added thereto and then, stirred by heating at 95° C. for 12 hours. 100 g of dichloromethane was added to the reactant and washed with water. The obtained organic layer was distilled under reduced pressure after silica filtration. The distilled mixture was dissolved in 10 g of dichloromethane and then added in a dropwise fashion to 100 g of normal hexane to precipitate it. The obtained precipitate was suction-filtered and further washed. A filtrate therefrom was dried, obtaining 0.97 g (Yield: 30%) of a compound represented by Chemical Formula C-1.

[Chemical Formula C-1]

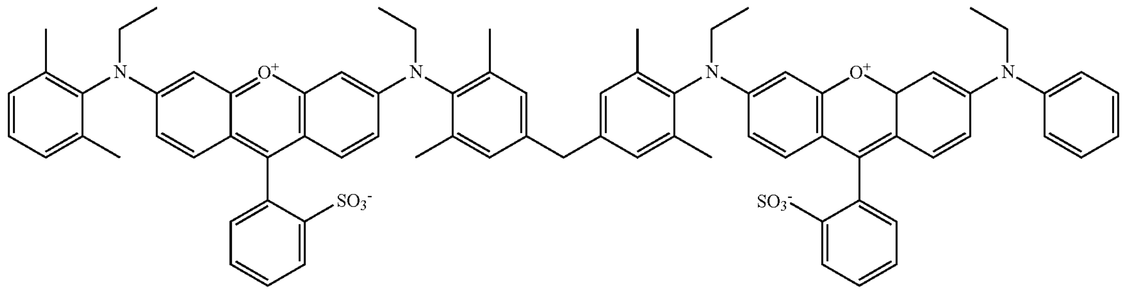

Maldi-tof MS: 1246.65 m/z

Comparative Synthesis Example 2: Synthesis of Compound Represented by Chemical Formula C-2

3.0 g of Intermediate 7 was put in a reactor, and 5 g of dimethyl formamide, 3.32 g of N-(3-bromopropyl)phthalimide, 1.71 g of $K_2CO_3$, and 0.21 g of KI were added thereto and then, stirred by heating at 95° C. for 8 hours. 100 g of dichloromethane was added to the reactant and washed with water. The obtained organic layer was distilled under reduced pressure after silica filtration. The distilled mixture was dissolved in 10 g of dichloromethane and then added in a dropwise fashion to 100 g of normal hexane to precipitate it. The obtained precipitate was suction-filtered and further washed. A filtrate therefrom was dried, obtaining 2.04 g (Yield: 42%) of a compound represented by Chemical Formula C-2.

[Chemical Formula C-2]

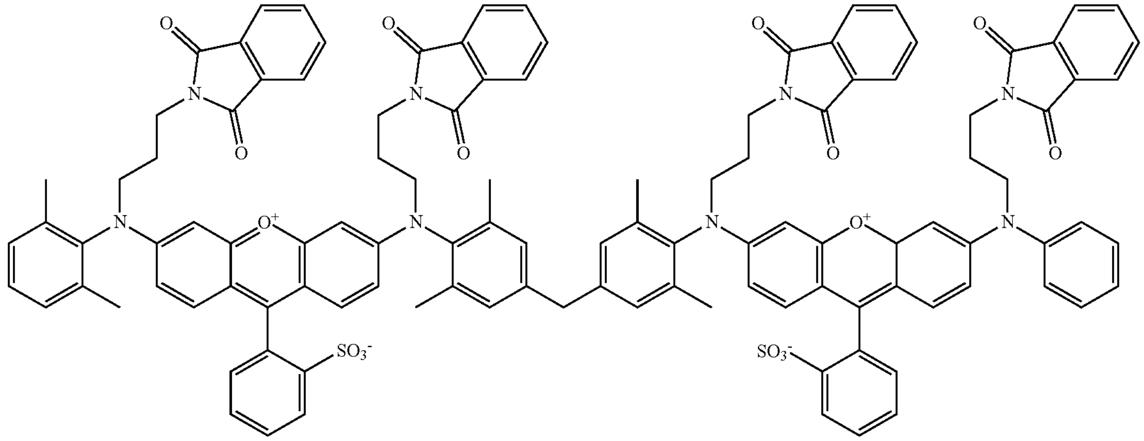

Maldi-tof MS: 1883.17 m/z

Comparative Synthesis Example 3: Synthesis of Compound Represented by Chemical Formula C-3

[Reaction Scheme 8]

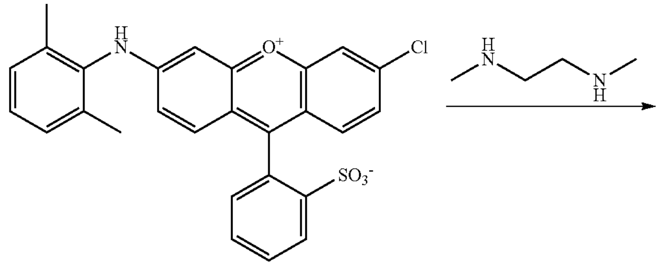

Intermediate 1

-continued

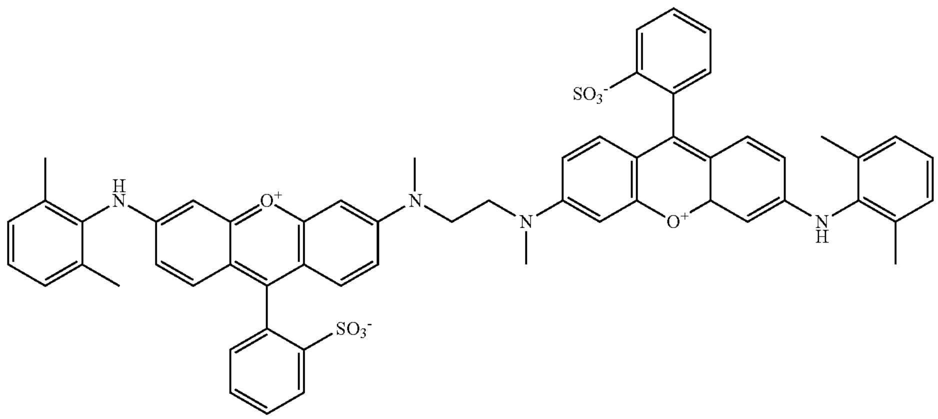

Intermediate 8

10 g of Intermediate 1 was put in a reactor, and 30 g of dimethyl formamide and 0.85 g of N,N'-dimethylethylenediamine were added thereto and then, stirred at 120° C. for 8 hours. 100 g of dichloromethane was added to the reactant and washed with water. The obtained organic layer was distilled under reduced pressure after silica filtration. The distilled mixture was dissolved in 10 g of dichloromethane and then added in a dropwise fashion to 100 g of normal hexane to precipitate it. The obtained precipitate was suction-filtered and further washed. A filtrate therefrom was dried, obtaining 6.5 g (Yield: 64%) of Intermediate 8.

3.0 g of Intermediate 8 was put in a reactor, and 5 g of dimethyl formamide, 1.94 g of N-(3-bromopropyl)phthalimide, 1.0 g of K2CO3, and 0.12 g of KI were added thereto and then, stirred by heating 95° C. for 8 hours. 100 g of dichloromethane was added to the reactant and washed with water. The obtained organic layer was distilled under reduced pressure after silica filtration. The distilled mixture was dissolved in 10 g of dichloromethane and then added in a dropwise fashion to 100 g of normal hexane to precipitate it. The obtained precipitate was suction-filtered and further washed. A filtrate therefrom was dried, obtaining 1.73 g (42%) yield of a compound represented by Chemical Formula C-3).

[Chemical Formula C-3]

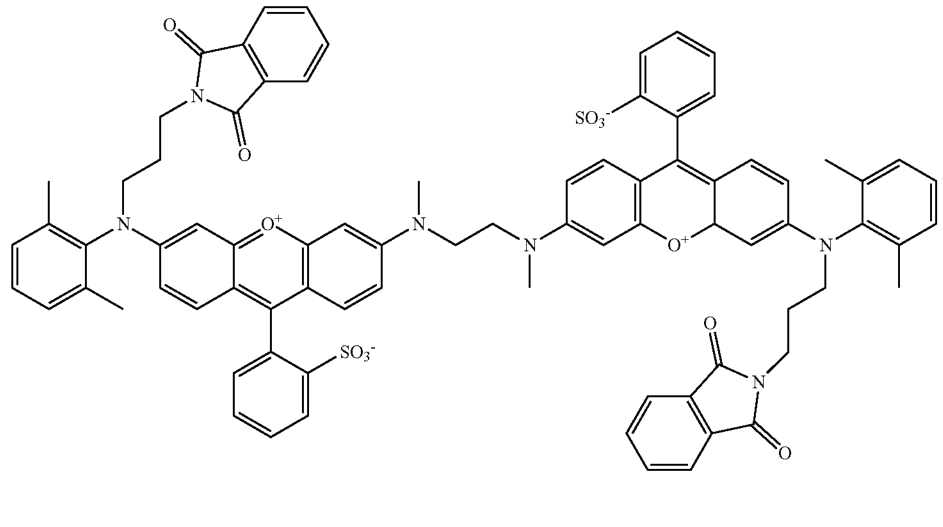

Maldi-tof MS: 1370.53 m/z

Comparative Synthesis Example 4: Synthesis of Compound Represented by Chemical Formula C-4

[Reactions Scheme 9]

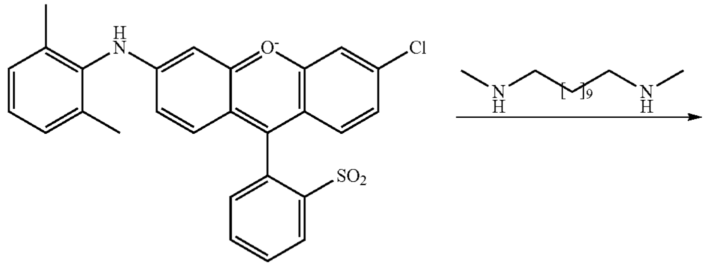

Intermediate 1

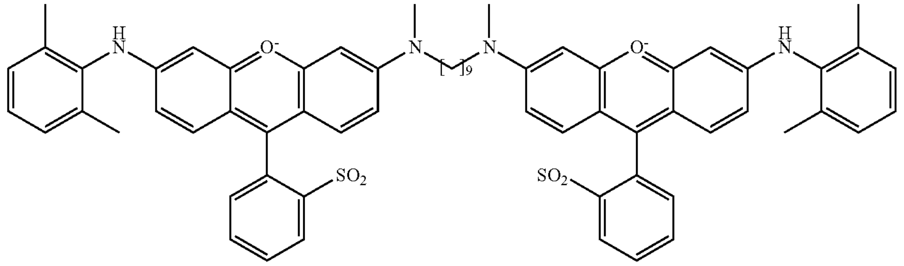

Intermediate 9

10 g of Intermediate 1 was put in a reactor, and 30 g of dimethyl formamide and 2.33 g of N,N'-dimethylundecane-diamine were added thereto and then, stirred at 120° C. for 8 hours. 100 g of dichloromethane was added to the reactant and washed with water. The obtained organic layer was distilled under reduced pressure after silica filtration. The distilled mixture was dissolved in 10 g of dichloromethane and then added in a dropwise fashion to 100 g of normal hexane to precipitate it. The obtained precipitate was suction-filtered and further washed. A filtrate therefrom was dried, obtaining 9.61 g (Yield: 84%) of Intermediate 9

3.0 g of Intermediate 9 was put in a reactor, and 5 g of dimethyl formamide, 1.72 g of N-(3-bromopropyl)phthalimide, 0.89 g of K2CO3, and 0.11 g of KI were added thereto and then, stirred by heating at 95° C. for 8 hours. 100 g of dichloromethane was added to the reactant and washed with water. The obtained organic layer was distilled under reduced pressure after silica filtration. The distilled mixture was dissolved in 10 g of dichloromethane and then added in a dropwise fashion to 100 g of normal hexane to precipitate it. The obtained precipitate was suction-filtered and further washed. A filtrate therefrom was dried, obtaining 3.00 g (Yield: 75%) of a compound represented by Chemical Formula C-4.

Chemical Formula C-4

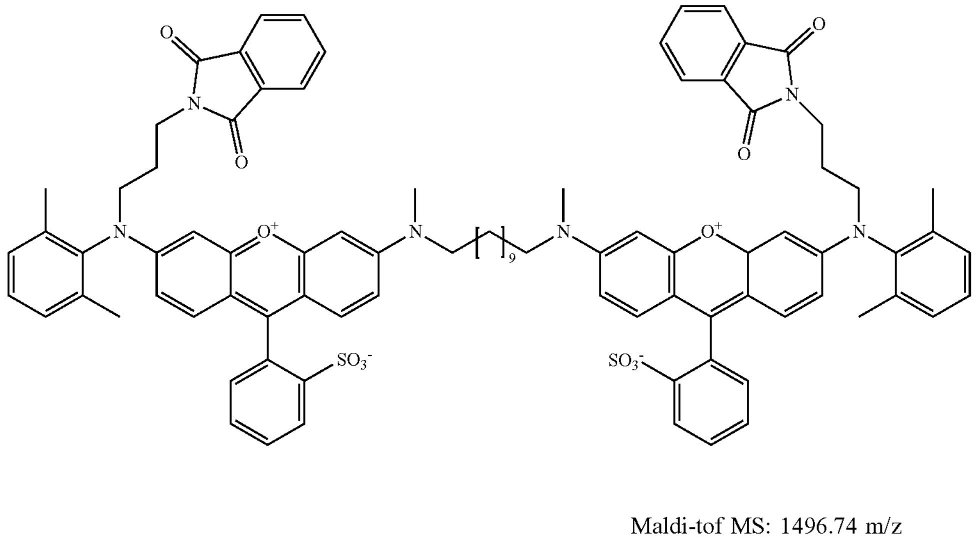

Maldi-tof MS: 1496.74 m/z

Comparative Synthesis Example 5: Synthesis of Compound Represented by Chemical Formula C-5

3.00 g (Yield: 75%) of a compound represented by Chemical Formula C-5 was obtained in the same manner as in Synthesis Example 1 except that N-(1-bromomethyl) phthalimide was used instead of the N-(3-bromopropyl) phthalimide.

[Chemical Formula C-5]

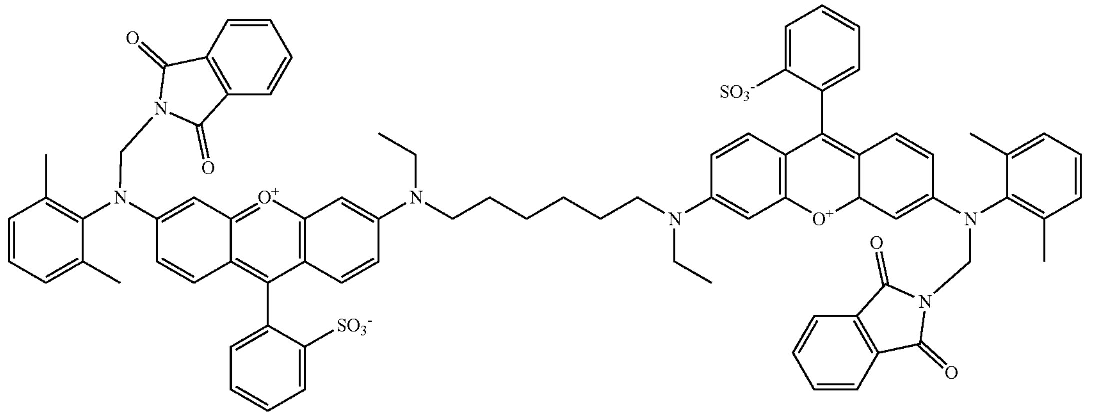

(Evaluation)

Evaluation 1: Measurement of Solubility 0.5 g of each compound Synthesis Examples 1 to 5 and Comparative Synthesis Examples 1 to 5 was added to a dilution solvent (PGMEA), and each corresponding solution was stirred with Mix-Rotar VMR-5 (Luchi Seieido Co., Ltd.) at 25° C. for 1 hour and then, evaluated with respect to solubility, and the results are shown in Table 2.

Solubility Evaluation Criteria 10 wt % or more of the compound (solute) was dissolved in the total amount of the diluent: ○

Less than 10 wt % of the compound (solute) was dissolved in the total amount of diluent: X

TABLE 1

(unit: wt %)

| | Solubility |
|---|---|
| Synthesis Example 1 | ○ |
| Synthesis Example 2 | ○ |
| Synthesis Example 3 | ○ |
| Synthesis Example 4 | ○ |
| Synthesis Example 5 | ○ |
| Comparative Synthesis Example 1 | X |
| Comparative Synthesis Example 2 | X |
| Comparative Synthesis Example 3 | X |
| Comparative Synthesis Example 4 | X |
| Comparative Synthesis Example 5 | X |

Referring to Table 1, the compounds of Synthesis Examples 1 to 5 according to one embodiment exhibited excellent solubility in the organic solvent, compared with the compounds of Comparative Synthesis Examples 1 to 5, and thus excellent color characteristics, when used for a photosensitive resin composition and the like.

(Synthesis of Photosensitive Resin Compositions)

Examples 1 to 5 and Comparative Examples 1 to 5

Each photosensitive resin composition of Examples 1 to 5 and Comparative Examples 1 to 5 was prepared by mixing the following components in each composition as shown in Table 2.

Specifically, a photopolymerization initiator was dissolved in a solvent and then, stirred for 2 hours at room temperature, and a binder resin and a photopolymerizable monomer were added thereto and then, stirred for 2 hours at room temperature. Subsequently, the compound (dye) prepared in the synthesis example and a pigment (pigment dispersion type) as a colorant were added to the reactant and then, stirred for 1 hour at room temperature (wherein the dye was added in an amount of 10 wt % based on the total amount of solids). Then, an antioxidant and a leveling agent were added thereto, and a product therefrom was three times filtered to remove impurities, preparing a photosensitive resin composition.

TABLE 2

(unit: wt %)

| | | Examples | | | | | Comparative Examples | | | | |
|---|---|---|---|---|---|---|---|---|---|---|---|
| | | 1 | 2 | 3 | 4 | 5 | 1 | 2 | 3 | 4 | 5 |
| Binder resin | EHPE-3150 (epoxy-bsaed, DAICEL) | 0.27 | 0.27 | 0.27 | 0.27 | 0.27 | 0.27 | 0.27 | 0.27 | 0.27 | 0.27 |
| | NPR-5216 (acryl-based, Miwon) | 7.91 | 7.91 | 7.91 | 7.91 | 7.91 | 7.91 | 7.91 | 7.91 | 7.91 | 7.91 |
| Photopoly-merizable monomer | GM66G0P (QPPC) | 4.92 | 4.92 | 4.92 | 4.92 | 4.92 | 4.92 | 4.92 | 4.92 | 4.92 | 4.92 |
| | Miramer 2200 (Miwon) | 0.37 | 0.37 | 0.37 | 0.37 | 0.37 | 0.37 | 0.37 | 0.37 | 0.37 | 0.37 |
| Photopoly-merization initiator | SPI-03 (Samyang Corp) | 0.78 | 0.78 | 0.78 | 0.78 | 0.78 | 0.78 | 0.78 | 0.78 | 0.78 | 0.78 |
| | IRG369 (BASF) | 0.01 | 0.01 | 0.01 | 0.01 | 0.01 | 0.01 | 0.01 | 0.01 | 0.01 | 0.01 |
| Antioxidant | AO-80 (ADEKA) | 0.01 | 0.01 | 0.01 | 0.01 | 0.01 | 0.01 | 0.01 | 0.01 | 0.01 | 0.01 |
| Pigment dispersion | Y138 pigment dispersion (EC-1200Y, ENF) | 17.79 | 17.79 | 17.79 | 17.79 | 17.79 | 17.79 | 17.79 | 17.79 | 17.79 | 17.79 |
| Dye | | 30.22 (Synthesis Example 1) | 30.22 (Synthesis Example 2) | 30.22 (Synthesis Example 3) | 30.22 (Synthesis Example 4) | 30.22 (Synthesis Example 5) | 30.22 (Comparative Synthesis Example 1) | 30.22 (Comparative Synthesis Example 2) | 30.22 (Comparative Synthesis Example 3) | 30.22 (Comparative Synthesis Example 4) | 30.22 (Comparative Synthesis Example 5) |
| Solvent | PGMEA (DAICEL) | 34.50 | 34.50 | 34.50 | 34.50 | 34.50 | 34.50 | 34.50 | 34.50 | 34.50 | 34.50 |
| Leveling agent | F554 (DIC) | 0.20 | 0.20 | 0.20 | 0.20 | 0.20 | 0.20 | 0.20 | 0.20 | 0.20 | 0.20 |
| Total | | 100.00 | 100.00 | 100.00 | 100.00 | 100.00 | 100.00 | 100.00 | 100.00 | 100.00 | 100.00 |

Evaluation 2: Color Coordinate, Luminance, and Chemical Resistance

Each photosensitive resin composition of Examples 1 to 5 and Comparative Examples 1 to 5 was coated to be 1 m to 3 m thick on a 1 mm-thick washed and degreased glass substrate and then, dried on a hot plate at 90° C. for 2 minutes, obtaining films. Subsequently, the films were exposed to light by using a high pressure mercury lamp having a main wavelength of 365 nm. Then, the films were dried in a forced convection drying furnace at 200° C. for 5 minutes, obtaining samples. As for pixel layers, C light source reference color purity was evaluated by using a spectrophotometer (MCPD3000, Otsuka Electronics Co., Ltd.), and luminance and a contrast ratio were calculated based on a CIE color coordinate, and then, the results are shown in Table 3.

In addition, the samples (photoresist layer) through the exposure and the drying were measured with respect to an initial thickness, allowed to stand in an NMP solvent at 25° C. for 10 minutes, and then, washed with ultrapure water for 30 seconds and dried by blowing compressed air. Subsequently, the spectrophotometer was used to measure del (E*) to check chemical resistance, and the results are shown in Table 3.

Chemical Resistance Evaluation Criteria del(E*) is less than 3: ○ del(E*) is 3 or more: X

TABLE 3

| | Luminance (%) | Contrast ratio | Chemical resistance |
|---|---|---|---|
| Example 1 | 65.5 | 14400 | ○ |
| Example 2 | 66.6 | 14900 | ○ |
| Example 3 | 66.8 | 15100 | ○ |
| Example 4 | 66.5 | 15000 | ○ |
| Example 5 | 66.6 | 14900 | ○ |
| Comparative Example 1 | 60.1 | 14300 | X |
| Comparative Example 2 | 60.0 | 14200 | X |
| Comparative Example 3 | 58.8 | 13800 | X |
| Comparative Example 4 | 59.8 | 13900 | X |
| Comparative Example 5 | 58.5 | 13700 | X |

Referring to Table 3, the photosensitive resin compositions of Examples 1 to 5 including the compound according to one embodiment as a dye exhibited excellent luminance, contrast ratio, and chemical resistance, compared with the photosensitive resin compositions of Comparative Examples 1 to 5 not including the compound, and thus may be easily applied to an image sensor and the like, providing a high-definition display device having excellent color characteristics.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

The invention claimed is:

1. A compound represented by Chemical Formula 1:

[Chemical Formula 1]

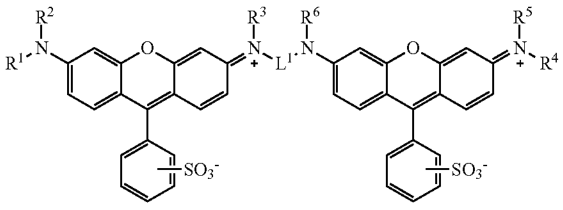

wherein, in Chemical Formula 1, $R^1$ to $R^6$ are each independently a hydrogen atom, a halogen atom, a substituted or unsubstituted C1 to C20 alkyl group, a group represented by Chemical Formula 2, or a substituted or unsubstituted C6 to C20 aryl group, one of $R^1$ to $R^3$ is a group represented by Chemical Formula 2 and the other two are different from the group represented by Chemical Formula 2, one of $R^4$ to Re is a group represented by Chemical Formula 2 and the other two are different from the group represented by Chemical Formula 2, $L^1$ is a substituted or unsubstituted C3 to C10 alkylene group, at least one of $R^1$ and $R^2$ is a substituted or unsubstituted C6 to C20 aryl group, and at least one of $R^4$ and $R^5$ is a substituted or unsubstituted C6 to C20 aryl group,

[Chemical Formula 2]

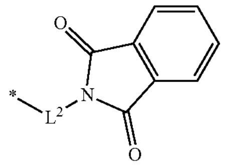

wherein, in Chemical Formula 2, $L^2$ is a substituted or unsubstituted C2 to C20 alkylene group, and

* is a linking point.

2. The compound of claim 1, wherein:

one of $R^1$ to $R^3$ is a group represented by Chemical Formula 2, and the other two are an unsubstituted C1 to C20 alkyl group or a substituted or unsubstituted C6 to C20 aryl group.

3. The compound of claim 1, wherein:

$R^1$ is a group represented by Chemical Formula 2, and $R^2$ and $R^3$ are each independently an unsubstituted C1 to C20 alkyl group or a substituted or unsubstituted C6 to C20 aryl group.

4. The compound of claim 1, wherein:

$R^3$ is a group represented by Chemical Formula 2, and $R^1$ and $R^2$ are each independently an unsubstituted C1 to C20 alkyl group or a substituted or unsubstituted C6 to C20 aryl group.

5. The compound of claim 1, wherein:

one of $R^4$ to $R^6$ is a group represented by Chemical Formula 2, and the other two are an unsubstituted C1 to C20 alkyl group or a substituted or unsubstituted C6 to C20 aryl group.

6. The compound of claim 1, wherein:

$R^4$ is a group represented by Chemical Formula 2, and $R^5$ and $R^6$ are each independently an unsubstituted C1 to C20 alkyl group or a substituted or unsubstituted C6 to C20 aryl group.

7. The compound of claim 1, wherein:

$R^6$ is a group represented by Chemical Formula 2, and $R^4$ and $R^5$ are each independently an unsubstituted C1 to C20 alkyl group or a substituted or unsubstituted C6 to C20 aryl group.

8. The compound of claim 1, wherein the compound represented by Chemical Formula 1 is represented by one of Chemical Formula 1-1 to Chemical Formula 1-5:

[Chemical Formula 1-1]

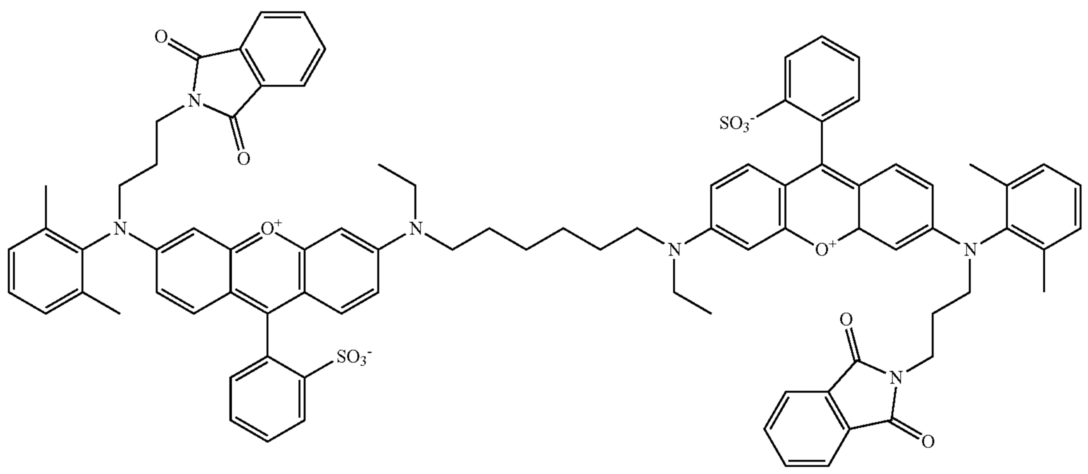

-continued
[Chemical Formula 1-2]
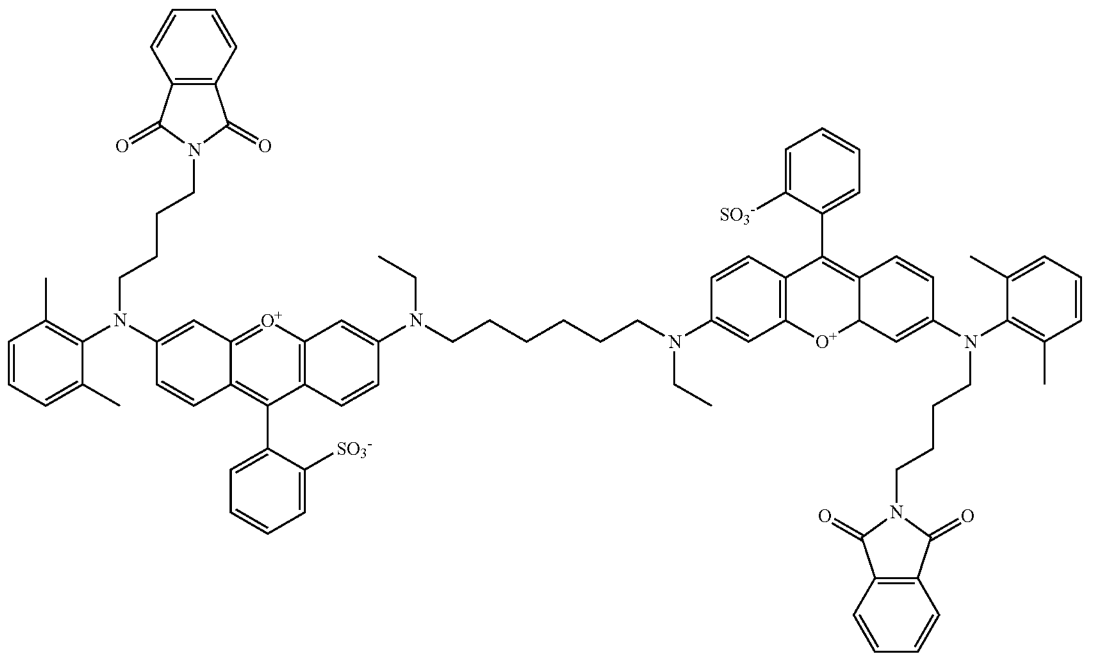
[Chemical Formula 1-3]
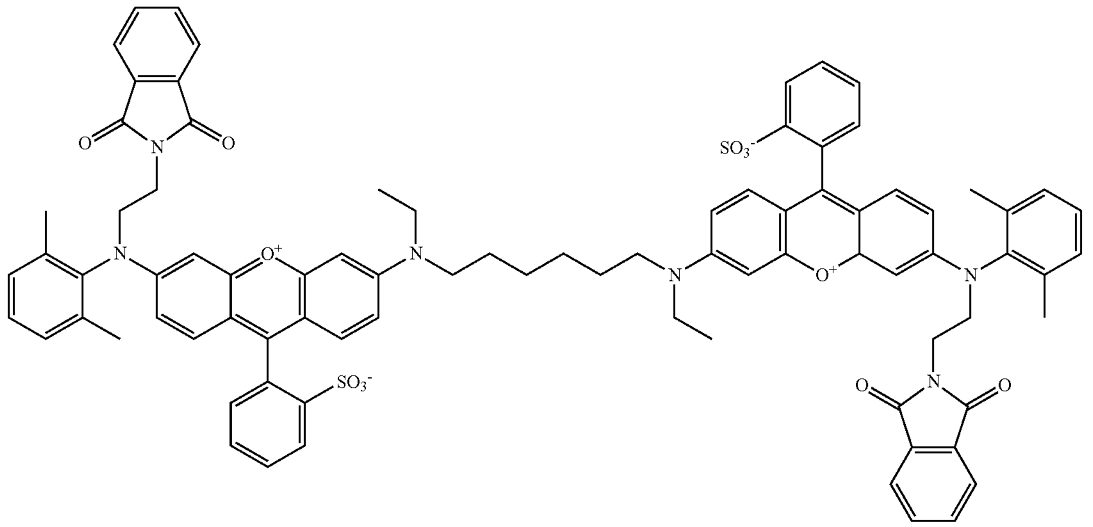

-continued

[Chemical Formula 1-4]

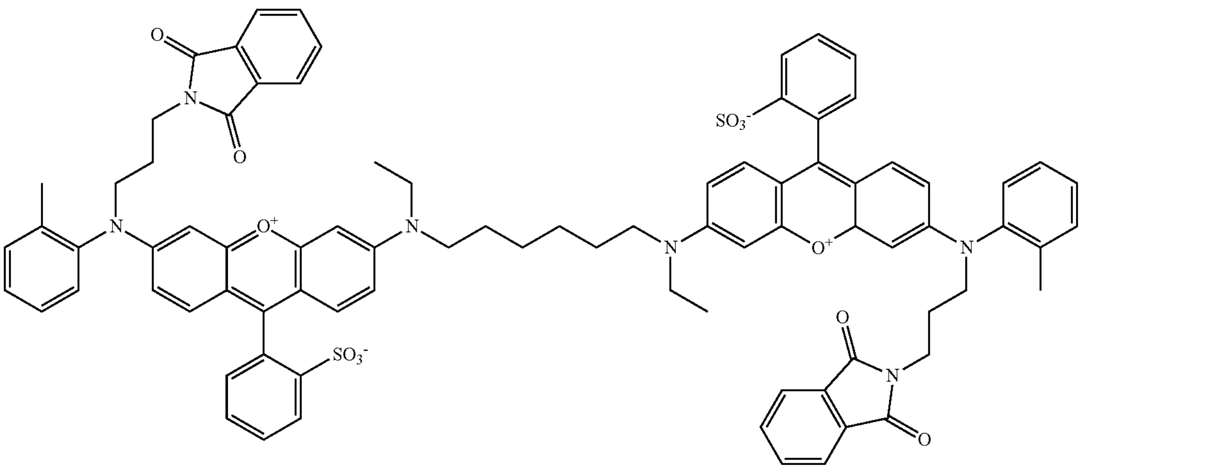

[Chemical Formula 1-5]

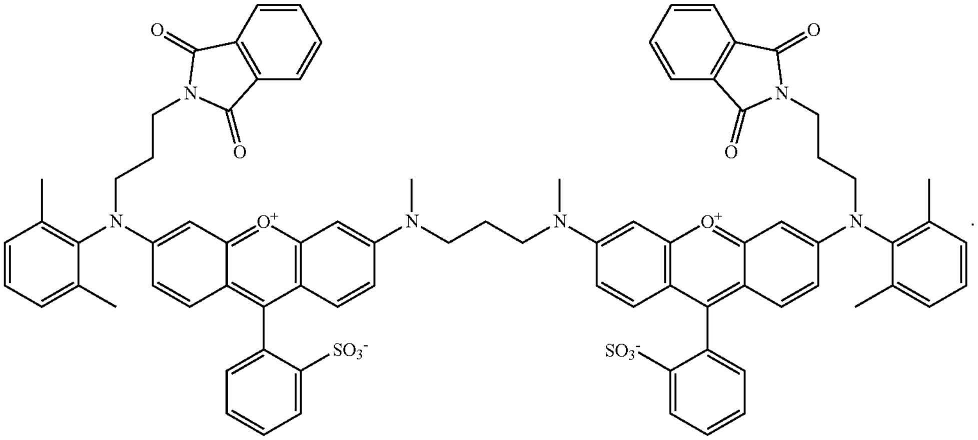

9. The compound of claim 1, wherein the compound is a red dye.

10. A photosensitive resin composition comprising the compound of claim 1.

11. The photosensitive resin composition of claim 10, wherein the compound is included in an amount of 7 wt % to 16 wt % based on a total amount of solids constituting the photosensitive resin composition.

12. The photosensitive resin composition of claim 10, wherein the photosensitive resin composition further includes a binder resin, a photopolymerizable compound, a photopolymerization initiator, and a solvent.

13. The photosensitive resin composition of claim 10, wherein the photosensitive resin composition further includes a pigment.

14. The photosensitive resin composition of claim 10, wherein the photosensitive resin composition further includes malonic acid; 3-amino-1,2-propanediol; a leveling agent; a fluorine surfactant; or a combination thereof.

15. The photosensitive resin composition of claim 10, wherein the photosensitive resin composition is for a complementary metal-oxide semiconductor image sensor.

16. A photosensitive resin film manufactured by using the photosensitive resin composition of claim 10.

17. A color filter comprising the photosensitive resin film of claim 16.

18. A complementary metal-oxide semiconductor image sensor comprising the color filter of claim 17.

* * * * *